United States Patent
Chen et al.

(10) Patent No.: US 12,149,049 B2
(45) Date of Patent: Nov. 19, 2024

(54) VERTICAL-CAVITY SURFACE-EMITTING LASER AND METHOD FOR FORMING THE SAME

(71) Applicant: WIN SEMICONDUCTORS CORP., Taoyuan (TW)

(72) Inventors: Yu-Chun Chen, Taoyuan (TW); Yu-Hsuan Huang, Taoyuan (TW); Chia-Ta Chang, Taoyuan (TW)

(73) Assignee: WIN SEMICONDUCTORS CORP., Taoyuan (TW)

( * ) Notice: Subject to any disclaimer, the term of this patent is extended or adjusted under 35 U.S.C. 154(b) by 635 days.

(21) Appl. No.: 17/527,308

(22) Filed: Nov. 16, 2021

(65) Prior Publication Data
US 2022/0209502 A1 Jun. 30, 2022

Related U.S. Application Data

(60) Provisional application No. 63/132,549, filed on Dec. 31, 2020.

(51) Int. Cl.
*H01S 5/183* (2006.01)

(52) U.S. Cl.
CPC ...... *H01S 5/18311* (2013.01); *H01S 5/18377* (2013.01); *H01S 5/18386* (2013.01)

(58) Field of Classification Search
CPC ............. H01S 5/18311; H01S 5/18386–18394
See application file for complete search history.

(56) References Cited

U.S. PATENT DOCUMENTS

| | | | | |
|---|---|---|---|---|
| 5,255,278 A | * | 10/1993 | Yamanaka | H01S 5/18355 372/27 |
| 5,561,683 A | * | 10/1996 | Kwon | H01S 5/18391 372/50.1 |

(Continued)

FOREIGN PATENT DOCUMENTS

| | | | | |
|---|---|---|---|---|
| CN | 107257084 A | * | 10/2017 | |
| CN | 112332211 A | * | 2/2021 | H01S 5/028 |

(Continued)

OTHER PUBLICATIONS

Chinese language office action dated Aug. 1, 2022, issued in application No. TW 110149510.

*Primary Examiner* — Joshua King
(74) *Attorney, Agent, or Firm* — McClure, Qualey & Rodack, LLP

(57) ABSTRACT

A vertical-cavity surface-emitting laser includes a substrate. A first mirror is disposed on the substrate. An active layer is disposed on the first mirror. An oxide layer is disposed on the active layer. An aperture is disposed on the active layer. The aperture is surrounded by the oxide layer. A second mirror is disposed on the aperture and the oxide layer. A high-contrast grating is disposed on the second mirror. The high-contrast grating includes a first grating element and a second grating element, and the first grating element and the second grating element are spaced apart from each other with an air gap therebetween. A passivation layer is disposed on the high-contrast grating. A first thickness of the passivation layer on a top surface of the first grating element is greater than a second thickness of the passivation layer on a first sidewall of the first grating element.

20 Claims, 17 Drawing Sheets

(56) References Cited

U.S. PATENT DOCUMENTS

| | | | | |
|---|---|---|---|---|
| 5,568,504 | A | * | 10/1996 | Kock .................. H01S 5/187 372/24 |
| 6,055,262 | A | * | 4/2000 | Cox ................ H01S 5/18386 257/E31.128 |
| 6,504,180 | B1 | * | 1/2003 | Heremans ............. H01L 33/025 257/E33.068 |
| 6,782,027 | B2 | * | 8/2004 | Cox .................. H01S 5/18355 372/50.1 |
| 6,794,687 | B1 | * | 9/2004 | Kurahashi ............... H01L 33/38 257/E33.068 |
| 7,348,195 | B2 | * | 3/2008 | Kurahashi ............... H01L 33/38 257/E33.068 |
| 7,873,090 | B2 | * | 1/2011 | Onishi ................ H01S 5/18355 372/50.12 |
| 8,000,374 | B2 | * | 8/2011 | Johnson ............. H01S 5/18355 372/99 |
| 8,809,089 | B2 | | 8/2014 | Shouji et al. |
| 10,305,248 | B2 | * | 5/2019 | Mathai ................ H01S 5/18363 |
| 10,826,274 | B2 | * | 11/2020 | Qiao .................. H01S 5/18386 |
| 11,276,987 | B2 | * | 3/2022 | Han .................... H01S 5/18391 |
| 2002/0106160 | A1 | * | 8/2002 | Cox .................. H01S 5/18386 372/50.1 |
| 2006/0013276 | A1 | | 1/2006 | McHugo |
| 2008/0002748 | A1 | * | 1/2008 | Masui .................. B82Y 20/00 372/45.01 |
| 2008/0029770 | A1 | * | 2/2008 | Masui .................. H01S 5/34333 257/79 |
| 2008/0279233 | A1 | * | 11/2008 | Carras ................. H01S 5/1228 372/45.01 |
| 2010/0316083 | A1 | * | 12/2010 | Chang-Hasnain ....... G02B 27/42 977/773 |
| 2012/0057902 | A1 | * | 3/2012 | Shouji .................... B32B 37/14 257/E33.072 |
| 2012/0128019 | A1 | * | 5/2012 | Chang-Hasnain ........................... H01S 5/18386 372/45.01 |
| 2013/0051410 | A1 | | 2/2013 | Chang-Hasnain et al. |
| 2015/0063753 | A1 | * | 3/2015 | Evans ..................... H01S 5/12 438/31 |
| 2016/0301188 | A1 | * | 10/2016 | Mathai ................ G02B 27/0905 |
| 2017/0294762 | A1 | * | 10/2017 | Kim ................... H01S 5/04257 |
| 2019/0252857 | A1 | * | 8/2019 | Qiao .................. H01S 5/18355 |
| 2021/0057888 | A1 | | 2/2021 | Seurin et al. |

FOREIGN PATENT DOCUMENTS

| | | | | | |
|---|---|---|---|---|---|
| CN | | 112366513 | A | * 2/2021 | .......... H01S 5/0282 |
| TW | | 200603507 | A | 1/2006 | |
| TW | | 201042865 | A | 12/2010 | |
| TW | | 201334336 | A | * 8/2013 | ........... B82Y 20/00 |
| TW | | 201937820 | A | 9/2019 | |
| WO | WO-2019217444 | A1 | * 11/2019 | ............ H01S 5/068 |
| WO | WO-2019217794 | A1 | * 11/2019 | .......... H01S 5/18311 |

* cited by examiner

VERTICAL-CAVITY SURFACE-EMITTING LASER AND METHOD FOR FORMING THE SAME

CROSS REFERENCE TO RELATED APPLICATIONS

This application claims the benefit of U.S. Provisional Application No. 63/132,549, filed on Dec. 31, 2020, the entirety of which is/are incorporated by reference herein.

BACKGROUND

Technical Field

The present disclosure relates to a vertical-cavity surface-emitting laser (VCSEL), and more particularly to a high-contrast grating vertical-cavity surface-emitting laser (HCG VCSEL) and a method for forming the same.

Description of the Related Art

A VCSEL is a semiconductor laser diode whose laser beam is emitted in the direction perpendicularly to its surface. VCSEL may be tested during production. VCSEL is widely adopted for use in various applications, such as optical fiber communications and biometrics.

HCG may be used to partially or fully replace a distributed Bragg reflector (DBR) in VCSEL. The HCG VCSEL device may be thinner, lighter, and the production cost may be reduced. The passivation layer over the HCG in the HCG VCSEL device may be necessary to protect the underlying structure, and may be critical to the performance of the HCG VCSEL.

Although existing VCSEL have generally been adequate for their intended purposes, they have not been entirely satisfactory in all respects, and need to be improved.

BRIEF SUMMARY

The present disclosure provides a VCSEL including a substrate, a first mirror, an active layer, an oxide layer, an aperture, a second mirror, a high-contrast grating, and a passivation layer. The first mirror is disposed on the substrate. The active layer is disposed on the first mirror. The oxide layer is disposed on the active layer. The aperture is disposed on the active layer. The aperture is surrounded by the oxide layer. The second mirror is disposed on the aperture and the oxide layer. The high-contrast grating is disposed on the second mirror. The high-contrast grating comprises a first grating element and a second grating element, and the first grating element and the second grating element are spaced apart from each other with an air gap therebetween. The passivation layer is disposed on the high-contrast grating. The first thickness of the passivation layer on the top surface of the first grating element is greater than the second thickness of the passivation layer on the first sidewall of the first grating element.

The present disclosure also provides a VCSEL including a substrate. A first distributed Bragg reflector is disposed on the substrate. An active layer is disposed on the first distributed Bragg reflector. A first oxide layer is disposed on the active layer. An aperture is disposed on the active layer. The aperture is surrounded by the oxide layer. A second distributed Bragg reflector is disposed on the aperture and the first oxide layer. A high-contrast grating is disposed on the second distributed Bragg reflector. The high-contrast grating includes a plurality of grating elements protruding from a second oxide layer disposed on the second distributed Bragg reflector. A passivation layer is disposed on the grating elements and the second oxide layer. The first thickness of the passivation layer on top surfaces of the grating elements is greater than the second thickness of the passivation layer on the second oxide layer between two adjacent grating elements.

The present disclosure also provides a method for forming a vertical-cavity surface-emitting laser. The method includes providing a semiconductor structure. The semiconductor structure includes a substrate, a first mirror on the substrate, an active layer on the first mirror, a first oxide layer on the active layer, an aperture on the active layer and surrounded by the first oxide layer, and a second mirror on the aperture and the first oxide layer; The method also includes forming a high-contrast grating on the second mirror of the semiconductor structure. The high-contrast grating comprises a plurality of grating elements spaced apart from one another. The method also includes forming a passivation layer on the grating elements. The first thickness of the passivation layer on the top surfaces of the grating elements is greater than the second thickness of the passivation layer on the sidewalls of the grating elements.

A detailed description is given in the following embodiments with reference to the accompanying drawings.

BRIEF DESCRIPTION OF DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 1I-2 and 1I-3 are enlarged cross-sectional representations of a VCSEL in accordance with some embodiments.

FIG. 2 is an enlarged cross-sectional representation of a modified VCSEL in accordance with some embodiments.

FIGS. 3A and 3B-1 are cross-sectional representations of various stages of forming a modified VCSEL in accordance with some embodiments.

FIG. 3B-2 is an enlarged cross-sectional representation of a modified VCSEL in accordance with some embodiments.

DETAILED DESCRIPTION

Figure 1A:
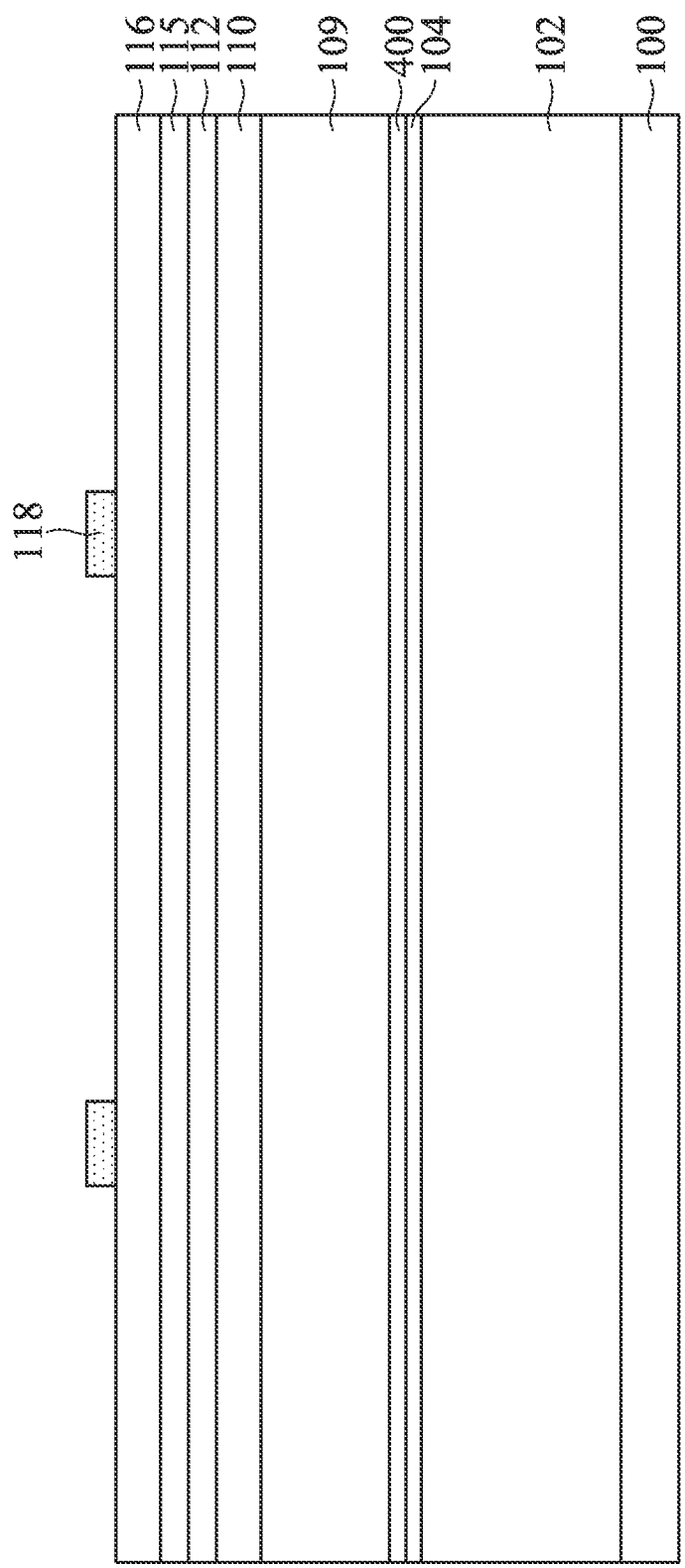
FIGS. 1A-1H, 1I-1, 1J are cross-sectional representations of various stages of forming a VCSEL in accordance with some embodiments.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to other elements or features as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Herein, the terms "around," "about," "substantial" usually mean within 20% of a given value or range, preferably within 10%, and better within 5%, or 3%, or 2%, or 1%, or 0.5%. It should be noted that the quantity herein is a substantial quantity, which means that the meaning of "around," "about," "substantial" are still implied even without specific mention of the terms "around," "about," "substantial."

Although some embodiments are discussed with operations performed in a particular order, these operations may be performed in another logical order. In different embodiments, additional operations can be provided before, during, and/or after the stages described the present disclosure. Some of the stages that are described can be replaced or eliminated for different embodiments. Additional features can be added to the semiconductor structure in the present disclosure. Some of the features described below can be replaced or eliminated for different embodiments.

The embodiments of the present disclosure provide a HCG VCSEL. With thicker passivation layer formed over the top surface of the grating elements than over the sidewalls and between the grating elements, the performance and the reliability of the HCG VCSEL device may reach a balance. In addition, air gaps are formed between passivation layers over sidewalls of the adjacent grating elements.

FIGS. 1A-1H, 1I-1, and 1J are cross-sectional representations of various stages of forming a VCSEL 10a in accordance with some embodiments.

A substrate 100 is provided, as shown in FIG. 1A in accordance with some embodiments. The substrate 100 may be a semiconductor substrate. For example, the substrate 100 may include III-V semiconductors, such as GaAs, GaN, AlGaN, AlN, AlGaAs, InP, InAlAs, InGaAs, or a combination thereof. In some embodiments, the substrate 100 includes GaAs.

Next, a first mirror 102 is formed over the substrate 100, as shown in FIG. 1A in accordance with some embodiments. In some embodiments, the first mirror 102 includes first semiconductor layers and second semiconductor layers. The first mirror 102 includes alternately stacked first semiconductor layers and second semiconductor layers over the substrate 100. The first semiconductor layer and the second semiconductor layer are used in pairs. The first semiconductor layers and the second semiconductor layers may include III-V semiconductors, such as AlGaAs, GaAs, AlAs, GaN, AlGaN, AlN, InP, InAlAs, InGaAs, or a combination thereof. The first semiconductor layers and the second semiconductor layers may be made of different materials with different refractive indexes. The first semiconductor layers and the second semiconductor layers may have a first conductivity type. In some embodiments, the first conductivity type is N-type. The first mirror 102 may be referred to as a distributed Bragg reflector (DBR) of a first conductivity type. The thickness of each layer of the first semiconductor layers and the second semiconductor layers may depend on the center wavelength of laser light generated in the VCSEL 10a. The first semiconductor layers and the second semiconductor layers may be formed by low pressure chemical vapor deposition (LPCVD) process, epitaxial growth process, other applicable methods, or a combination thereof. The epitaxial growth process may include molecular beam epitaxy (MBE), metal organic chemical vapor deposition (MOCVD), or vapor phase epitaxy (VPE). The total number of such pairs of the first semiconductor layers and the second semiconductor layers are not limited, depending on the demand of design.

Afterwards, an active layer 104 is formed over the first mirror 102, as shown in FIG. 1A in accordance with some embodiments. The active layer 104 may include a number of quantum wells and quantum well barriers. The quantum wells and the quantum well barriers may include III-V semiconductors such as AlGaAs, GaAs, AlAs, GaN, AlGaN, AlN, InP, InAlAs, InGaAs, or a combination thereof. The quantum wells and the quantum well barriers may be made of different materials, and the quantum well barriers may have a greater energy band gap than the quantum wells. The active layer 104 may generate the optical power for the VCSEL 10a. The active layer 104, including the quantum wells and the quantum well barriers, may be formed by a low pressure chemical vapor deposition (LPCVD) process, an epitaxial growth process, other applicable methods, or a combination thereof. The epitaxial growth process may include molecular beam epitaxy, metal organic chemical vapor deposition, or vapor phase epitaxy. The active layer 104 may separate the underlying first mirror 102 and the subsequently formed second mirror.

Next, a semiconductor layer 400 is formed over the active layer 104, as shown in FIG. 1A in accordance with some embodiments. The semiconductor layer 400 may include III-V semiconductors, such as GaAs, AlGaAs, AlAs, GaN, AlGaN, AlN, InP, InAlAs, InGaAs, or a combination thereof. In some embodiments, the semiconductor layer 400 includes AlGaAs. The semiconductor layer 400 may include a III-V semiconductor with a gradient refractive indexes. The semiconductor layer 400 may be formed by a low pressure chemical vapor deposition (LPCVD) process, epitaxial growth process, other applicable methods, or a combination thereof. The epitaxial growth process may include molecular beam epitaxy, metal organic chemical vapor deposition, or vapor phase epitaxy.

Next, a second mirror 109 is formed over the active layer 104, as shown in FIG. 1A in accordance with some embodiments. The second mirror 109 may include third semiconductor layers and fourth semiconductor layers alternating stacked over the active layer 104. The third semiconductor layers and the fourth semiconductor layers may include III-V semiconductors, such as AlGaAs, GaAs, AlAs, GaN, AlGaN, AlN, InP, InAlAs, InGaAs, or a combination thereof. The third semiconductor layers and the fourth semiconductor layers may be made of different materials with different refractive indexes. In some embodiments, the third semiconductor layers and the fourth semiconductor layers have a second conductivity type. In some embodiments, the second conductivity type is P-type. The second mirror 109 may be referred to as a distributed Bragg reflector (DBR) of a second conductivity type. The light generated by the active layer 104 may be reflected by the first mirror 102 and the second mirror 109. The light may be resonated between the first mirror 102 and the second mirror 109.

Processes used to form the second mirror 109 may be similar to, or the same as, those used to form the first mirror 102 described previously and are not repeated herein for brevity. The number of the third semiconductor layers and the fourth semiconductor layers are not limited herein, depending on the demand of design. The second mirror 109 may be thinner than the first mirror 102.

Next, a semiconductor layer 110 is formed over the second mirror 109, as shown in FIG. 1A in accordance with some embodiments. The semiconductor layer 110 may include III-V semiconductors, such as AlGaAs, GaAs, AlAs, GaN, AlGaN, AlN, InP, InAlAs, InGaAs, or a combination thereof. The semiconductor layer 110 may be formed by a low pressure chemical vapor deposition process, an epitaxial growth process, other applicable methods, or a combination thereof. The epitaxial growth process may include molecular beam epitaxy, metal organic chemical vapor deposition, or vapor phase epitaxy.

Next, a semiconductor layer 112 is formed over the semiconductor layer 110, as shown in FIG. 1A in accordance with some embodiments. The semiconductor layer 112 may include III-V semiconductors, such as AlGaAs, GaAs, AlAs, GaN, AlGaN, AlN, InP, InAlAs, InGaAs, or a combination thereof. In some embodiments, the semiconductor layer 112 is made of AlGaAs with graded Al composition. The semiconductor layer 112 may be formed by a low pressure chemical vapor deposition process, an epitaxial growth process, other applicable methods, or a combination thereof. The epitaxial growth process may include molecular beam epitaxy, metal organic chemical vapor deposition, or vapor phase epitaxy.

Next, a layer 115 is formed over the semiconductor layer 112, as shown in FIG. 1A in accordance with some embodiments. The layer 115 may include III-V semiconductors such as AlGaAs, GaAs, AlAs, GaN, AlGaN, AlN, InP, InAlAs, InGaAs, metal oxides with low refractive index such as ITO, dielectric films such as Sift, SiON, SiN, polymer material, or a combination thereof. The layer 115 may be formed by a low pressure chemical vapor deposition process, an epitaxial growth process, other applicable methods, or a combination thereof. The epitaxial growth process may include molecular beam epitaxy, metal organic chemical vapor deposition, or vapor phase epitaxy.

Next, a layer 116 is formed over the layer 115, as shown in FIG. 1A in accordance with some embodiments. The layer 116 may include III-V semiconductors or metal, such as GaAs, AlGaAs, AlAs, GaN, AlGaN, AlN, InP, InAlAs, InGaAs, Al, or a combination thereof. The layer 116 may be formed by a low pressure chemical vapor deposition process, an epitaxial growth process, e-beam evaporation, resistive heating evaporation, electroplating, sputtering, physical vapor deposition (PVD), atomic layer deposition (ALD), other applicable methods, or a combination thereof. The epitaxial growth process may include molecular beam epitaxy, metal organic chemical vapor deposition, or vapor phase epitaxy. In some embodiments, the refractive index of the material of the layer 116 is greater than the refractive index of the material of the layer 115.

Next, a contact metal 118 is formed on the layer 116, as shown in FIG. 1A in accordance with some embodiments. In some embodiments, an ohmic contact is formed between the contact metal 118 and the layer 116. The contact metal 118 may include Pt, Ti, Au, Al, Pd, Cu, W, other suitable metal, its alloy, or a combination thereof. A contact metal 118 may be formed on the layer 116 by e-beam evaporation, resistive heating evaporation, electroplating, sputtering, physical vapor deposition (PVD), chemical vapor deposition (CVD), atomic layer deposition (ALD), another suitable method, or a combination thereof. In some embodiments, the contact electrode material is formed by e-beam evaporation. The electrode material is then patterned by a photolithography and an etching processes, and the contact metal 118 is formed.

Figure 1B:
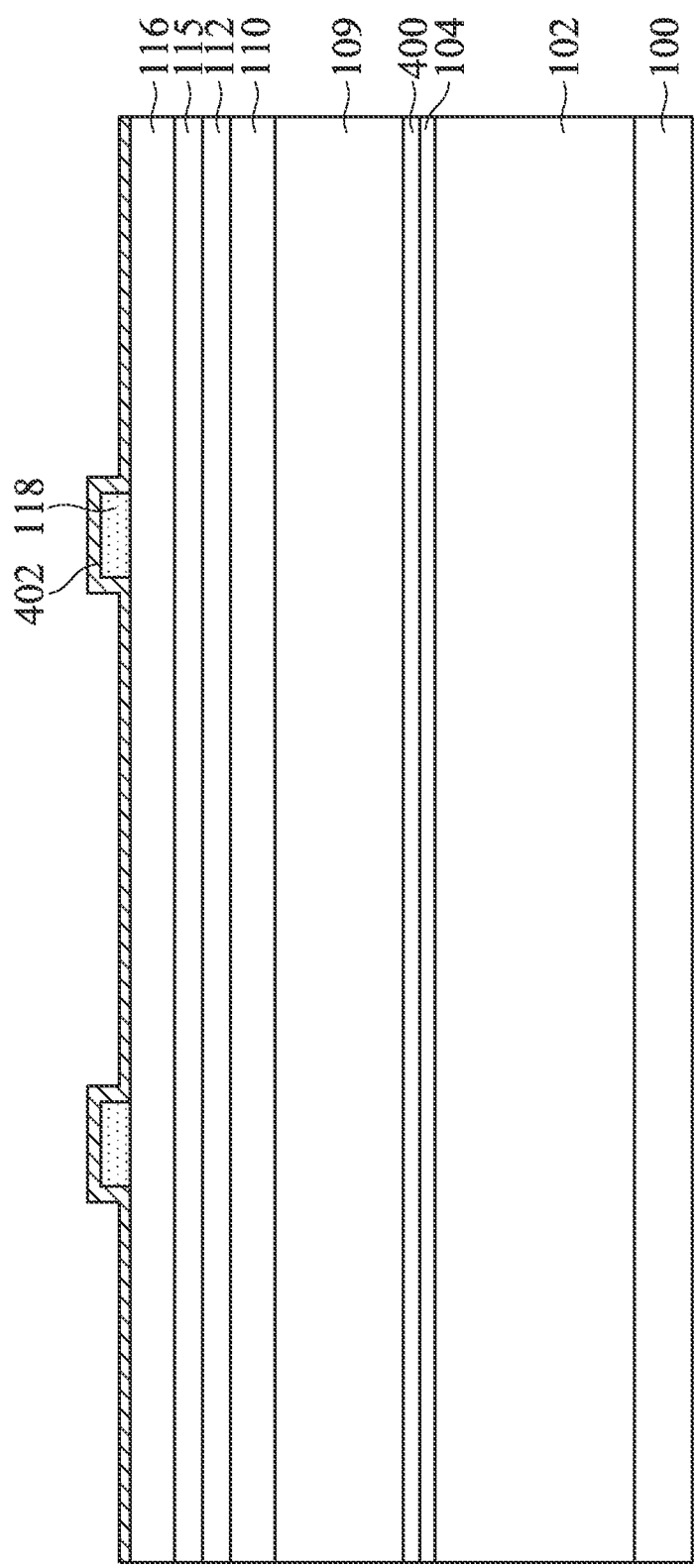

Next, a first insulating layer 402 is conformally formed over the contact metal 118 and the layer 116, as shown in FIG. 1B in accordance with some embodiments. As shown in FIG. 1B, the first insulating layer 402 is over the second mirror 109. The first insulating layer 402 may be made of silicon nitride, aluminum oxide, other suitable insulating material, or a combination thereof. In some embodiments, the first insulating layer 402 includes silicon nitride. The first insulating layer 402 may be formed by a deposition process. The deposition process may include a CVD process (such as LPCVD, PECVD, SACVD, or FCVD), an ALD process, another applicable method, or a combination thereof. In some embodiments, the thickness of the first insulating layer 402 is in a range of about 200 Å to about 750 Å.

Figure 1C:
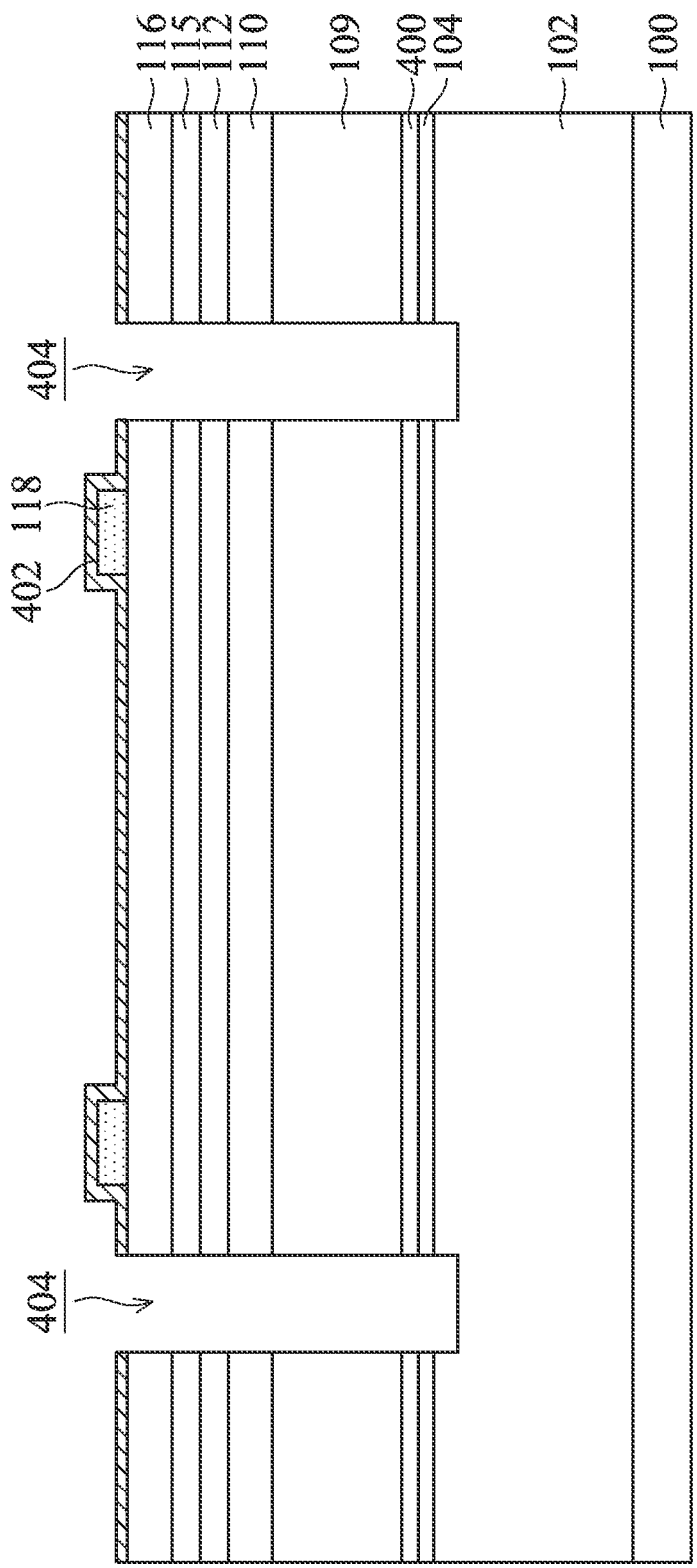

Next, a trench 404 is formed through the first insulating layer 402, the layer 116, the layer 115, the semiconductor layer 112, the semiconductor layer 110, the second mirror 109, the semiconductor layer 400, the active layer 104, and stopped in the first mirror 102, as shown in FIG. 1C in accordance with some embodiments. The trench 404 may be formed by a patterning process. The patterning process may include a photolithography process and an etching process. Examples of photolithography processes include photoresist coating, soft baking, mask aligning, exposure, post-exposure baking, developing the photoresist, rinsing and drying. The etching process may be a dry etching process or a wet etching process. In some embodiments, the etching process is a reactive-ion etching (RIE) using inductively coupled plasma (ICP) as etchers. In some embodiments, the trench 404 penetrates into the first insulating layer 402 and reaches the top of the first mirror 102. In some embodiments, the trench 404 exposes sidewalls of the first insulating layer 402, the layer 116, the layer 115, the semiconductor layer 112, the semiconductor layer 110, the second mirror 109, the semiconductor layer 400, the active layer 104, and the first mirror 102. In some embodiments, the first mirror 102 is exposed from the trench 404. In some embodiments, the bottom surface of the trench 404 is below the bottom surface of the active layer 104. In some embodiments, the bottom surface of the trench 404 is in the first mirror 102.

Figure 1D:
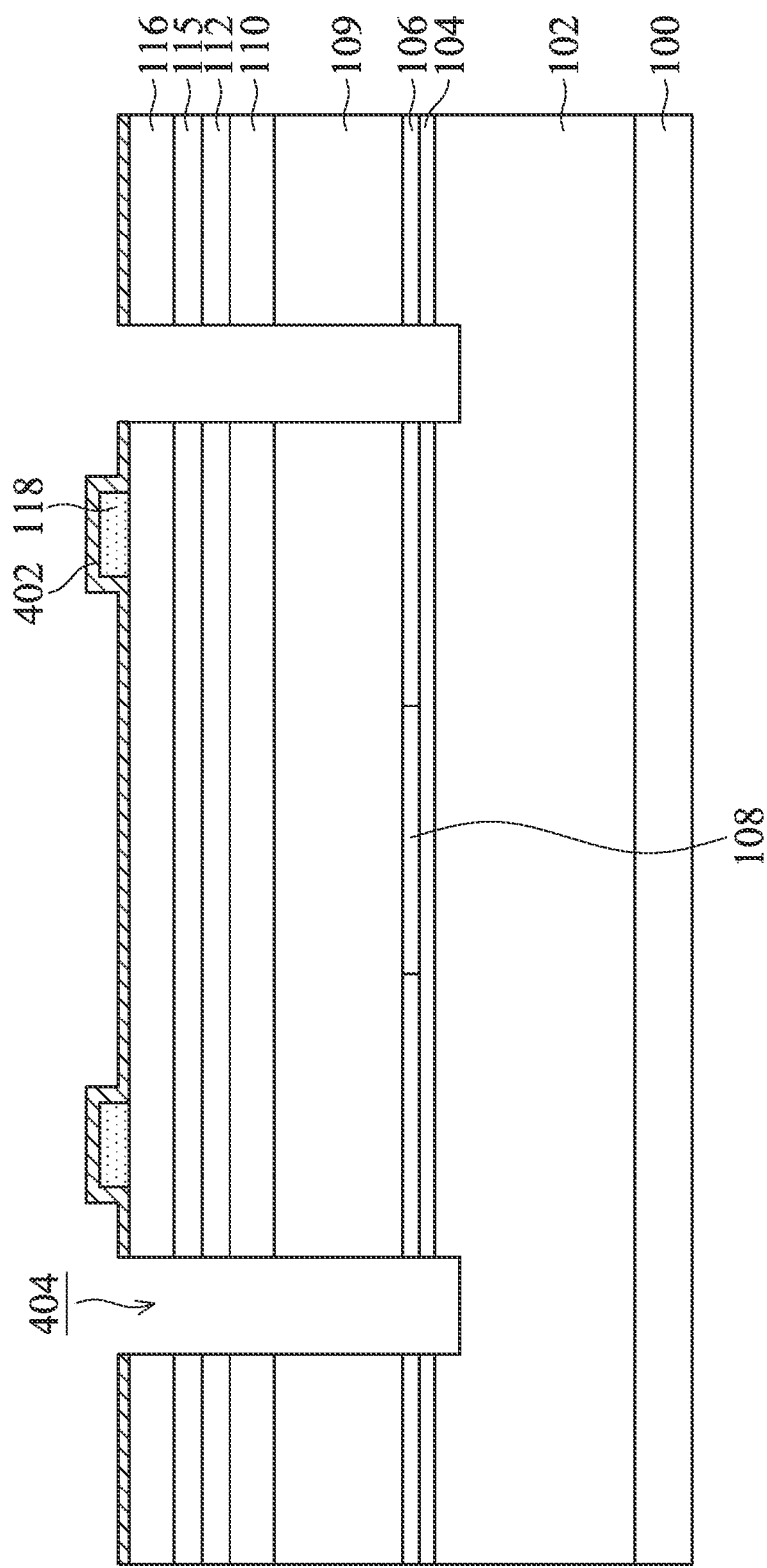

Next, as shown in FIG. 1D, a portion of the semiconductor layer 400 is oxidized to form an oxide layer 106 over the active layer 104. The semiconductor layer 400 may be Al doped layer with high Al composition. The Al composition may affect the oxidation rate. It may be better to keep oxidation rate stable. In some embodiments, the active layer 104 includes AlGaAs. The oxide layer 106 may include insulating oxides such as $Al_2O_3$. In some embodiments, the oxide layer 106 is formed by a furnace oxidation process.

As shown in FIG. 1D, only a portion of the semiconductor layer 400 is oxidized. In some embodiments, the un-oxidized portion of the semiconductor layer 400 may serve as an aperture 108. The aperture may be include III-V semiconductors, such as AlGaAs, GaAs, AlAs, GaN, AlGaN, AlN, InP, InAlAs, InGaAs, or a combination thereof. In some embodiments, the aperture 108 is surrounded by the oxide layer 106. In some embodiments, the second mirror 109 is over the aperture 108 and the oxide layer 106. The aperture 108 may confine a current from the contact metal 118 passing through the underlying active layer 104 and the first mirror 102.

Figure 1E:
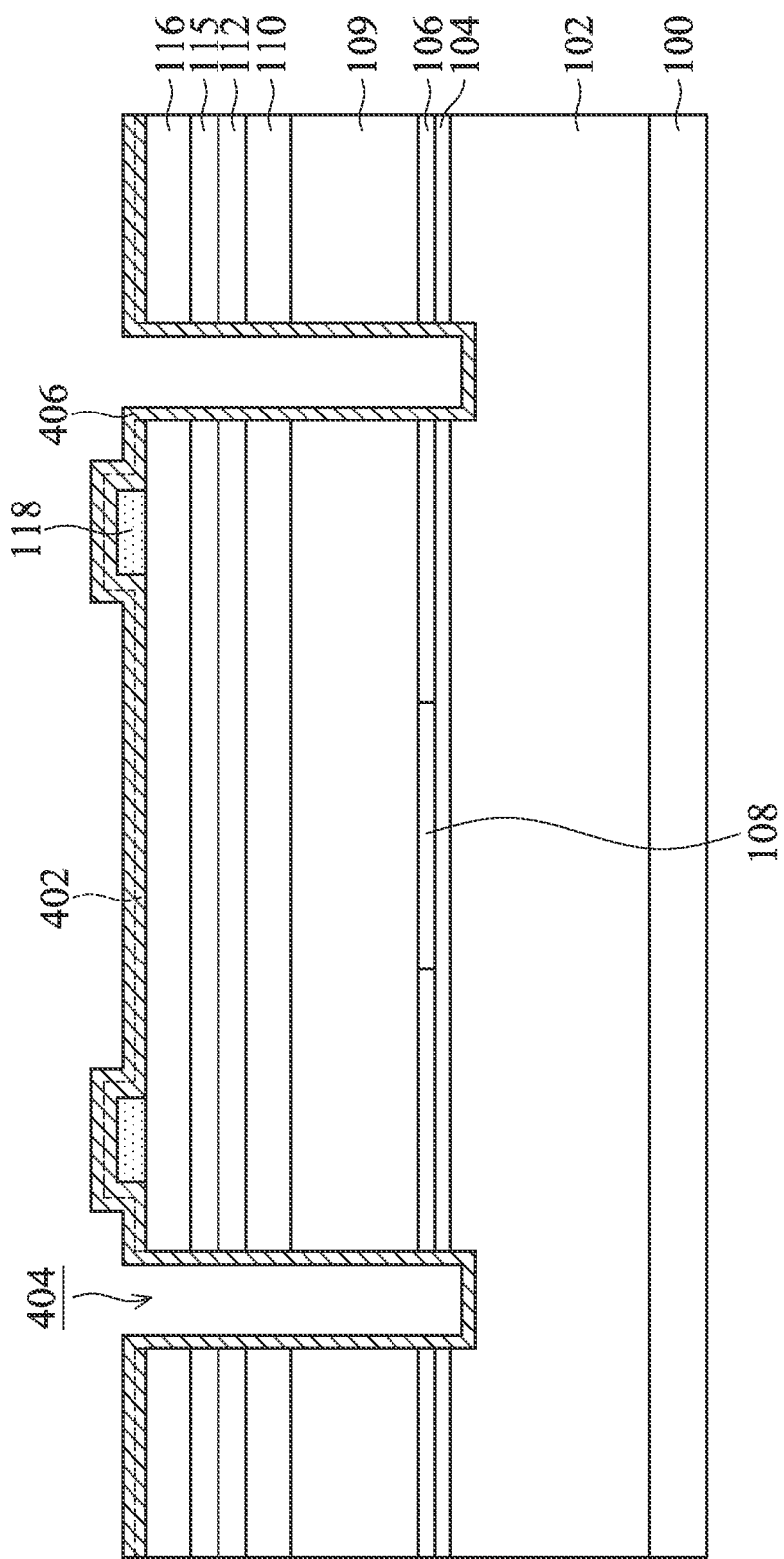

Afterwards, a second insulating layer 406 is conformally formed over the first insulating layer 402 and the sidewalls and the bottom surface of the trench 404, as shown in FIG. 1E in accordance with some embodiments. The second insulating layer 406 may be formed over the insulating layer 402 and extended into the trench 404. The second insulating layer 406 may be made of silicon nitride, aluminum oxide, other suitable insulating material, or a combination thereof. The second insulating layer 406 may be formed by a CVD process (such as LPCVD, PECVD, SACVD, or FCVD), an ALD process, another applicable method, or a combination thereof. In some embodiments, the second insulating layer 406 and the first insulating layer 402 are made of the same materials. Therefore, there may be no obvious interface between the first insulating layer 402 and the second insulating layer 406 so the boundary is shown in dashed lines. In some embodiments, the thickness of the second insulating layer 406 is in a range of about 550 Å to about 1650 Å.

Figure 1F:
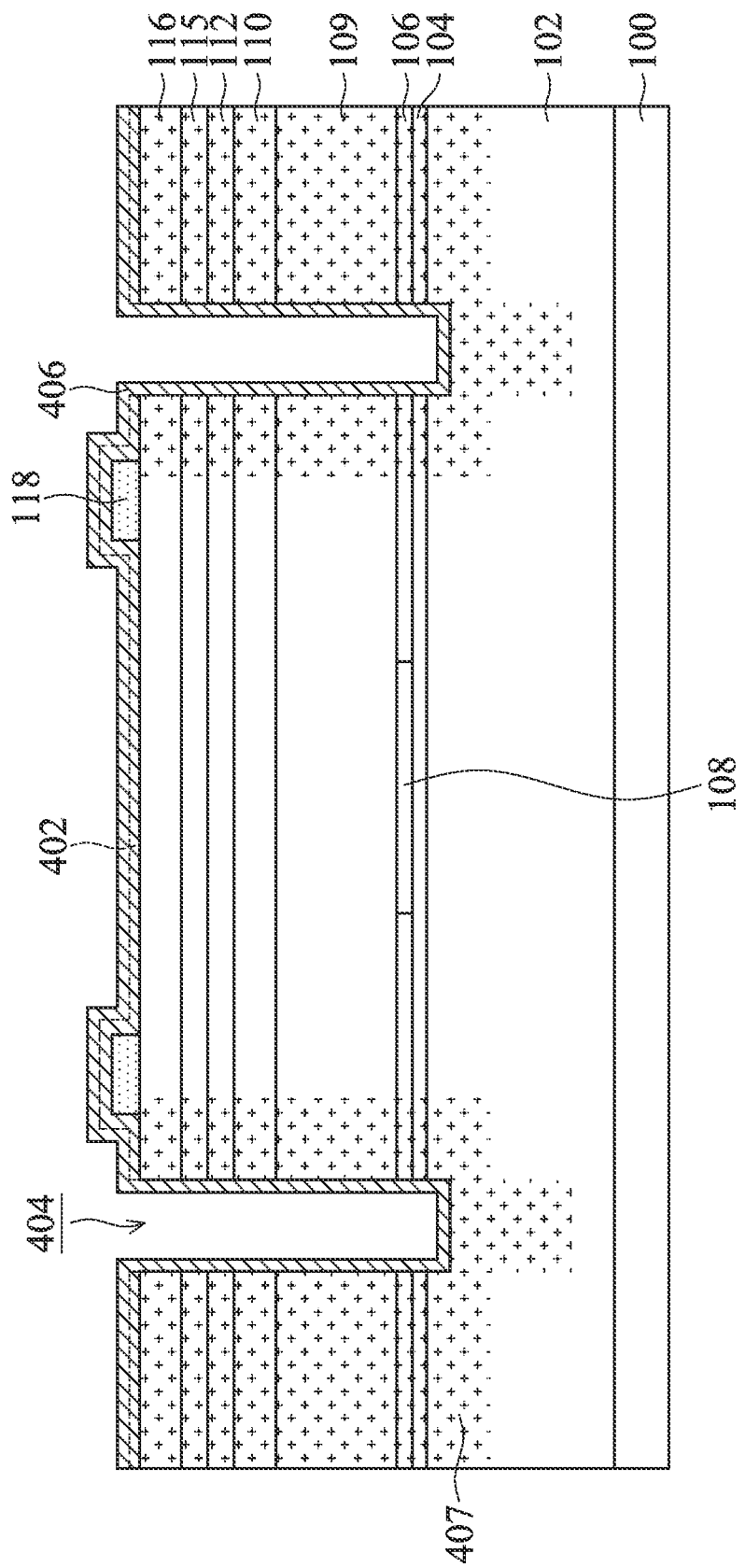

Next, an isolation region 407 is formed using an implantation process, as shown in FIG. 1F in accordance with some embodiments. The isolation region 407 may penetrate through the active layer 104 for chip isolation. In some embodiments, the bottom surface of the isolation region 407 is below the bottom surface of the active layer 104. The isolation region 407 may surround the active area of the VCSEL 10a. In some embodiments, the isolation region 407 is doped by Helium or Boron.

Figure 1G:
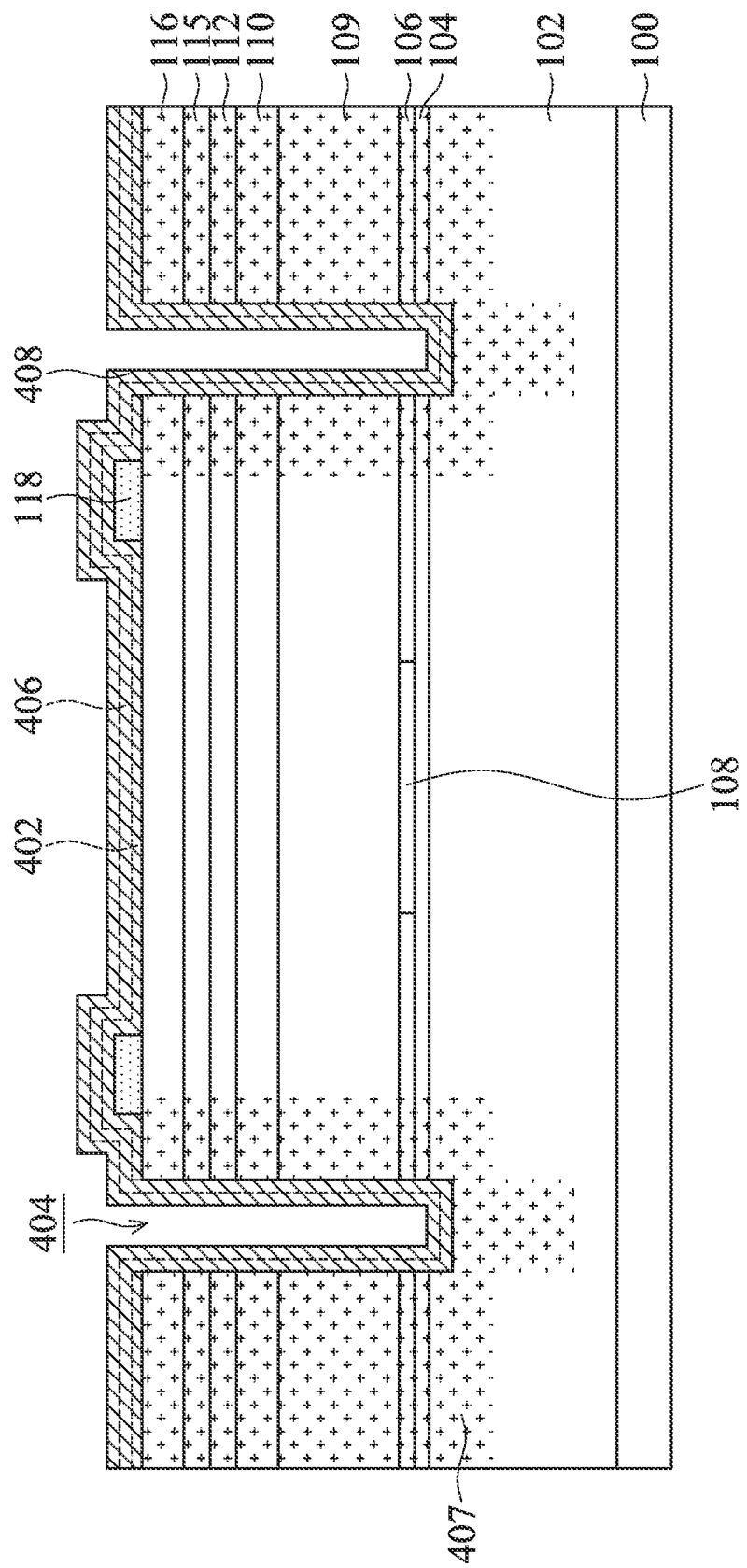

Afterwards, a third insulating layer 408 is conformally formed over the second insulating layer 406, and the sidewalls and the bottom surface of the trench 404, as shown in FIG. 1G in accordance with some embodiments. The third insulating layer 408 may be formed over the second insulating layer 406 and extended into the trench 404. The third insulating layer 408 may be made of silicon nitride, aluminum oxide, other suitable insulating material, or a combination thereof. The third insulating layer 408 may be formed by a CVD process (such as LPCVD, PECVD, SACVD, or FCVD), an ALD process, another applicable method, or a combination thereof. In some embodiments, the third insulating layer 408, the second insulating layer 406 and the first insulating layer 402 are made of the same materials. Therefore, there may be no obvious interface between them, so the boundaries are shown in dashed lines. In some embodiments, the thickness of the third insulating layer 408 is in a range of about 250 Å to about 750 Å.

Figure 1H:
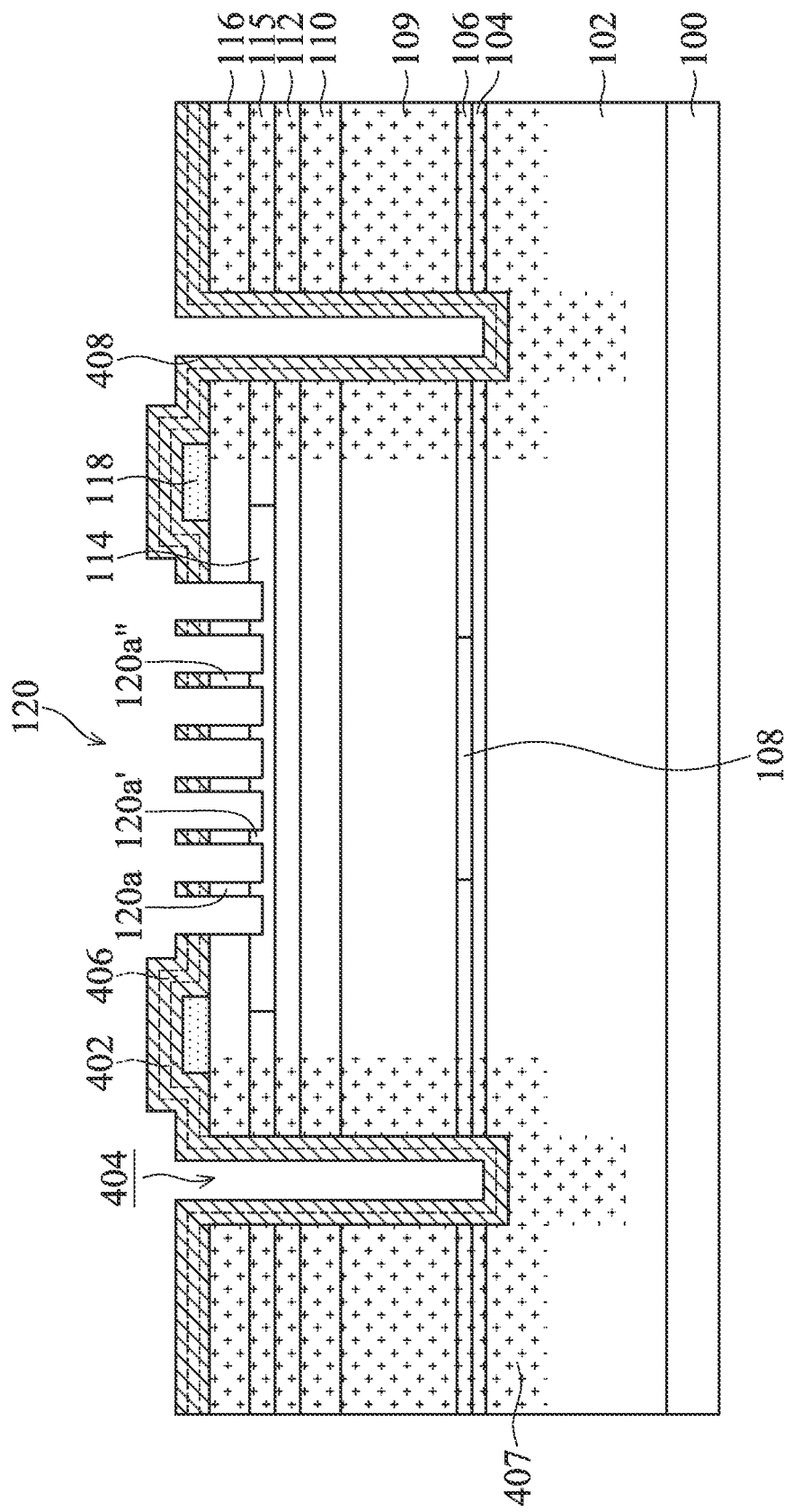

Next, the third insulating layer 408, the second insulating layer 406, the first insulating layer 402, the layer 116, and the layer 115 are patterned to form high-contrast grating 120 on the semiconductor layer 112 on the aperture 108. The high-contrast grating 120 may be formed in the active area surrounded by the isolation region 407, as shown in FIG. 1H in accordance with some embodiments. The high-contrast grating 120 may include multiple grating elements 120a.

After patterning the layer 116 and the layer 115, the layer 115 may be exposed. Later, an oxidation process is performed and a portion of the layer 115 is oxidized, and an oxide layer 114 is formed in the active area. The oxide layer 114 may be made of insulator such as silicon oxide or aluminum oxide. In some embodiments, the oxide layer 114 is over the semiconductor layer 112. In some embodiments, the layer 115 is over the semiconductor layer 112 and surrounds the oxide layer 114.

In some embodiments, the oxide layer 114 is also patterned, and be the lower portion 120a' of the grating element 120a in the high-contrast grating 120. In the embodiments, the lower portion 120a' of the grating elements 120a and the oxide layer 114 are integrally formed. The patterned layer 116 may be upper portion 120a" of the grating element 120a in the high-contrast grating 120. In some embodiments, the refractive index of the material of the layer 116 is greater than the refractive index of the material of the oxide layer 114.

Figures 1, 1I:
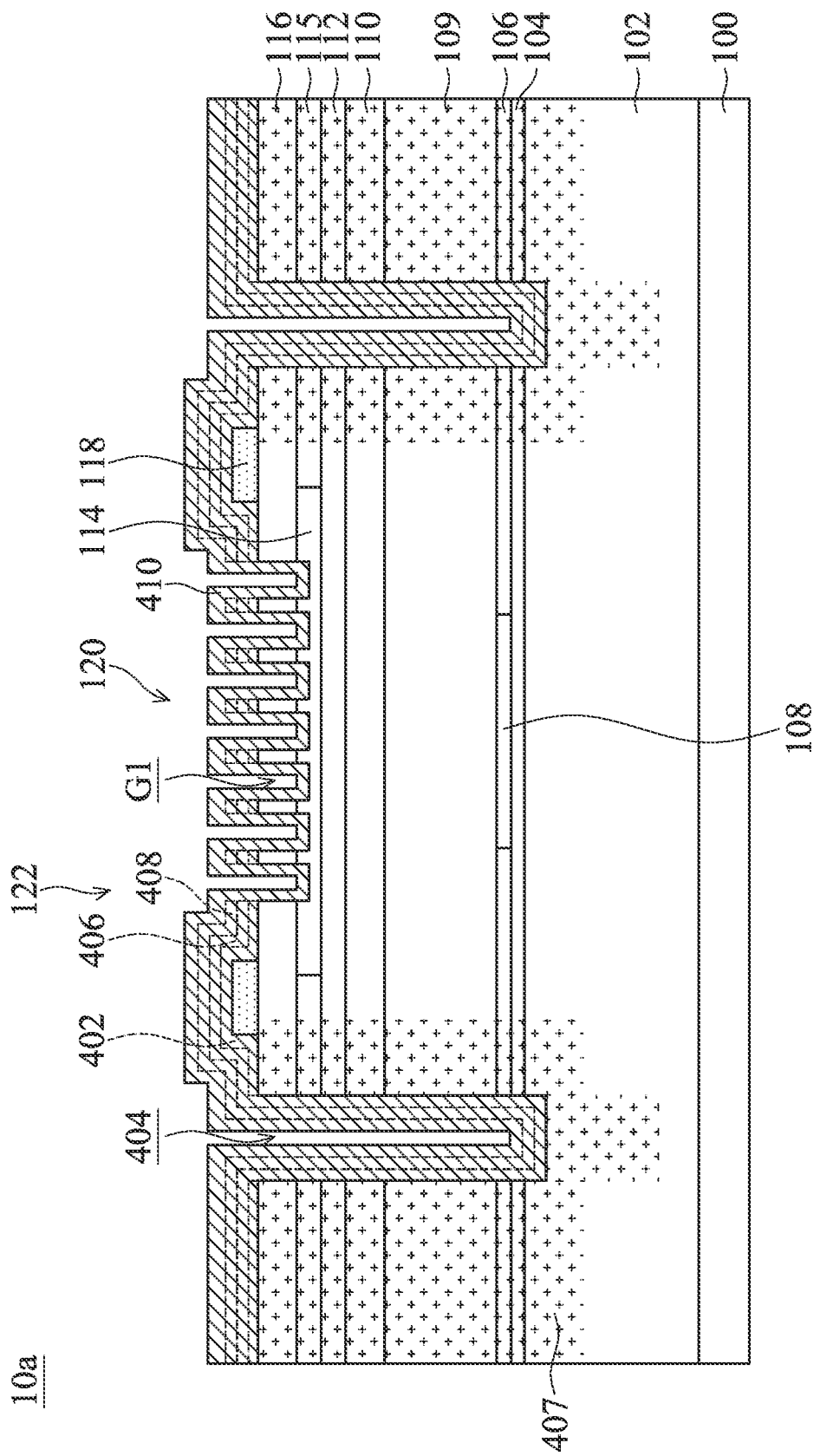

Next, a fourth insulating layer 410 is conformally formed over the third insulating layer 408, the sidewalls and the bottom surface of the trench 404, and the sidewalls and the bottom surface of the air gaps G1 between the grating elements 120a of the high-contrast grating 120, as shown in FIG. 1I-1 in accordance with some embodiments. The fourth insulating layer 410 may be formed over the third insulating layer 408 and extended into the trench 404 and the air gaps G1. The fourth insulating layer 410 may be made of silicon nitride, aluminum oxide, other suitable insulating material, or a combination thereof. The fourth insulating layer 410 may be formed by a CVD process (such as LPCVD, PECVD, SACVD, or FCVD), an ALD process, another applicable method, or a combination thereof. In some embodiments, the fourth insulating layer 410, the third insulating layer 408, the second insulating layer 406, and the first insulating layer 402 are made of the same materials. Therefore, there may be no obvious interface between them, so the boundaries are shown in dashed lines. In some embodiments, the thickness of the fourth insulating layer 410 is in a range of about 250 Å to about 750 Å. The fourth insulating layer 410, the third insulating layer 408, the second insulating layer 406, and the first insulating layer 402, either alone or a combination thereof, may serve as a passivation layer 122. In some embodiments, the passivation layer 122 includes an insulator (e.g., silicon nitride, aluminum oxide, another applicable insulator, or a combination thereof).

Figures 1, 1I, 2:
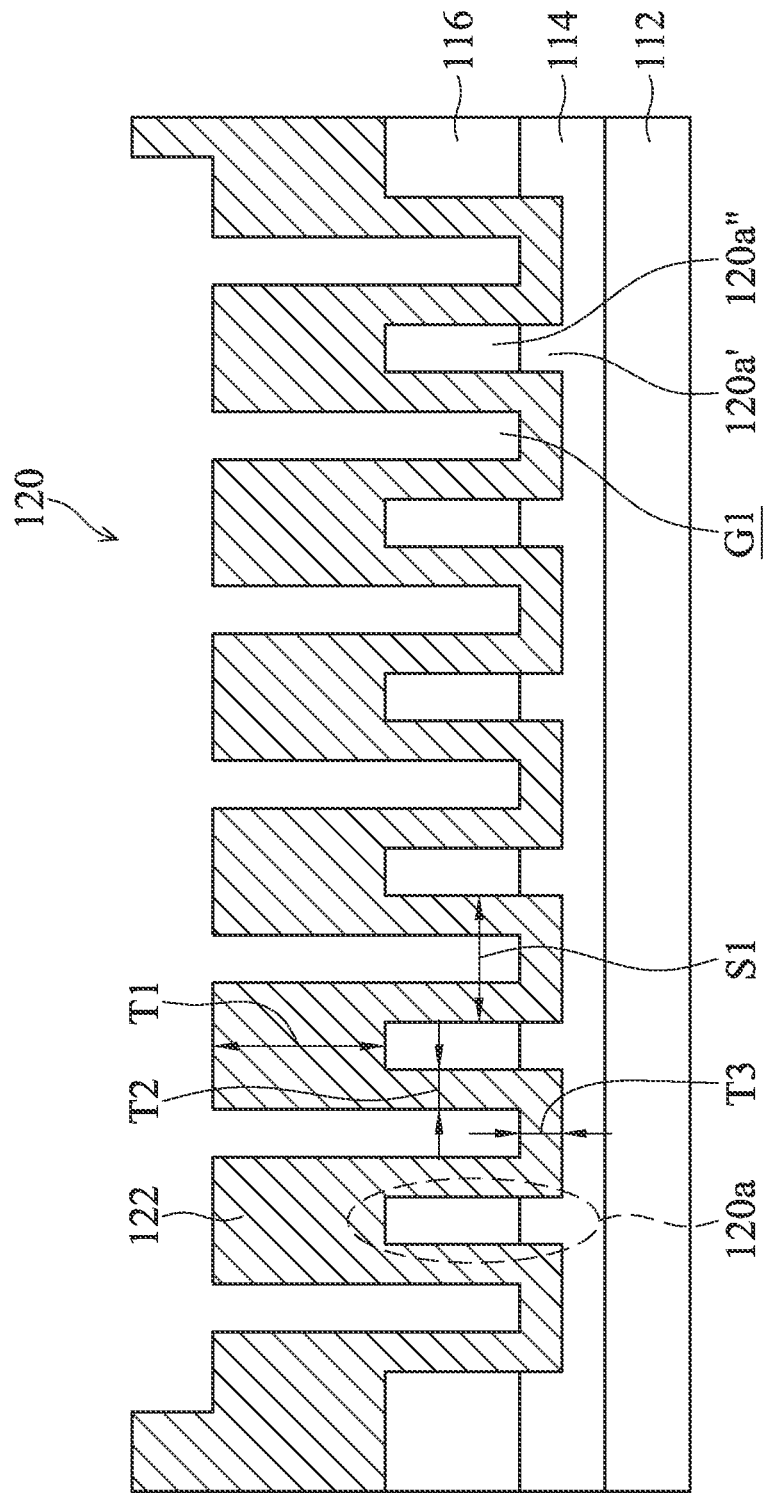
Figures 1, 1L, 2, 3:
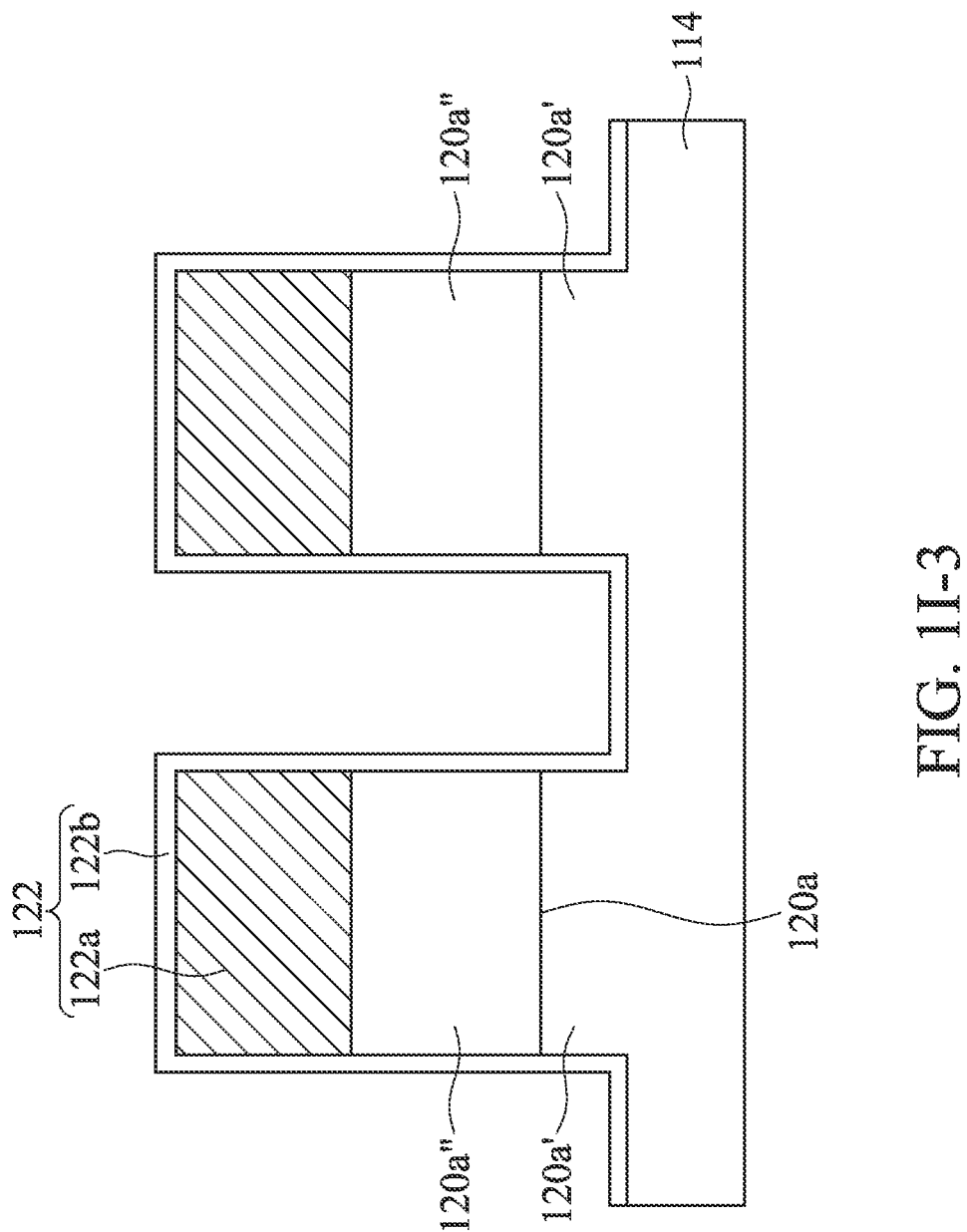

FIG. 1I-2 is an enlarged cross-sectional representation of the VCSEL 10a in accordance with some embodiments. In some embodiments, as shown in FIG. 1I-2, the high-contrast grating 120 includes multiple grating elements 120a spaced apart from one another. In some embodiments, the passivation layer 122 over sidewalls of adjacent grating elements 120a are separated from each other. The air-gap G1 and the spacing S1 between adjacent grating elements 120a may be defined by sidewalls of adjacent grating elements 120a, as shown in FIG. 1I-2.

In some embodiments, as shown in FIG. 1I-2, the passivation layer 122 is formed on the high-contrast grating 120. The air gap G1 may be partially filled with the passivation layer 122. In some embodiments, as shown in FIG. 1I-2, the thickness T1 of the passivation layer 122 on top surfaces of the grating elements 120a is greater than the thickness T2 of the passivation layer 122 on sidewalls of the grating elements 120a.

In some embodiments, the ratio of the thickness T1 to the thickness T2 may be in a range of about 3 to about 100. In some embodiments, the ratio of the thickness T1 to the thickness T2 may be greater than 1 and less than or equal to 3 ($1 < T1/T2 \leq 3$). In some embodiments, the ratio of the thickness T1 to the thickness T2 may be in a range of about 3 to about 5. If the ratio of the thickness T1 to the thickness T2 is too great, the power of the VCSEL 10a may be decayed. If the ratio of the thickness T1 to the thickness T2 is too less, the passivation may be not enough, and the reliability may be worse. In some embodiments, the ratio of the thickness T2 to the spacing S1 is in a range of about 0.05 to about 0.5. If the ratio of the thickness T2 to the spacing S1 is too great, the passivation layer 122 on sidewalls of the adjacent grating elements 120a may be merged. If the ratio of the thickness T2 to the spacing S1 is too less, passivation may be not enough, and the reliability may be worse.

In some embodiments, as shown in FIG. 1I-2, the thickness T1 of the passivation layer 122 on top surfaces of the grating elements 120*a* is greater than the thickness T3 of the passivation layer 122 on the second mirror 109 between adjacent grating elements 120*a*. The ratio of the thickness T1 to the thickness T3 may be in a range between about 3 to about 100. In some embodiments, the ratio of the thickness T1 to the thickness T3 may be greater than 1 and less than or equal to 3 (1<T1/T2≤3). In some embodiments, the ratio of the thickness T1 to the thickness T3 may be in a range of about 3 to about 5. In some embodiments, the thickness T2 is substantially the same as the thickness T3.

The grating element 120*a* may include a lower portion 120*a*' and an upper portion 120*a*", as shown in FIG. 1I-2. The lower portion 120*a*' and the upper portion 120*a*" may be formed by different materials. In some embodiments, the refractive index of the upper portion 120*a*" is greater than that of the lower portion 120*a*'. In some embodiments, the refractive index of the upper portion 120*a*" is greater than that of the passivation layer 122. In some embodiments, the upper portion 120*a*" includes metal, semiconductor (e.g., III-V semiconductor), or a combination thereof. In some embodiments, the lower portion 120*a*' includes insulator (e.g., oxide). In some embodiments, the lower portion 120*a*' is formed by patterning the oxide layer 114. In some embodiments, the lower portion 120*a*' is formed by patterning the upper portion of the oxide layer 114, and thus the lower portion 120*a*' of the grating element 120*a* protrudes from the lower portion of the oxide layer 114, as shown in FIG. 1I-2. In some embodiments, the bottom surface of the passivation layer 122 is lower than an interface between the lower portion 120*a*' and the upper portion 120*a*".

FIG. 1I-3 is an enlarged cross-sectional representation of the VCSEL 10*a* in accordance with some embodiments. In some embodiments, as shown in FIG. 1I-3, the passivation layer 122 includes a first sub-layer 122*a* and a second sub-layer 122*b* over the first sub-layer 122*b*. In some embodiments, the first sub-layer 122*a* and a second sub-layer 122*b* are made of different materials. The first sub-layer 122*a* may be made of silicon nitride, and the second sub-layer 122*b* may be made of aluminum oxide. The first sub-layer 122*a* may be formed on the top surfaces of the grating elements 120*a*, and the first sub-layer 122*a* may not be formed on the sidewalls of the grating elements 120*a*. The second sub-layer 122*b* may line the sidewalls of the grating elements 120*a*, the sidewalls of the first sub-layer 122*a*, and the top surface of the first sub-layer 122*a*. The fourth insulating layer 410 may be made of aluminum oxide and may be referred to as a second sub-layer 122*b* of the passivation layer 122. The third insulating layer 408, the second insulating layer 406, and the first insulating layer 402 may be made of silicon nitride and serve as a first sub-layer 122*a* of the passivation layer 122.

Next, openings are formed through the passivation layer 122 over the contact metal 118. The contact metal 118 may be exposed from the openings. The openings may be formed in passivation layer 122 by a lithography process, an etching process (e.g., wet etching process, a dry etching process, other applicable processes, or a combination thereof), other applicable processes, or a combination thereof.

Figure 1J:
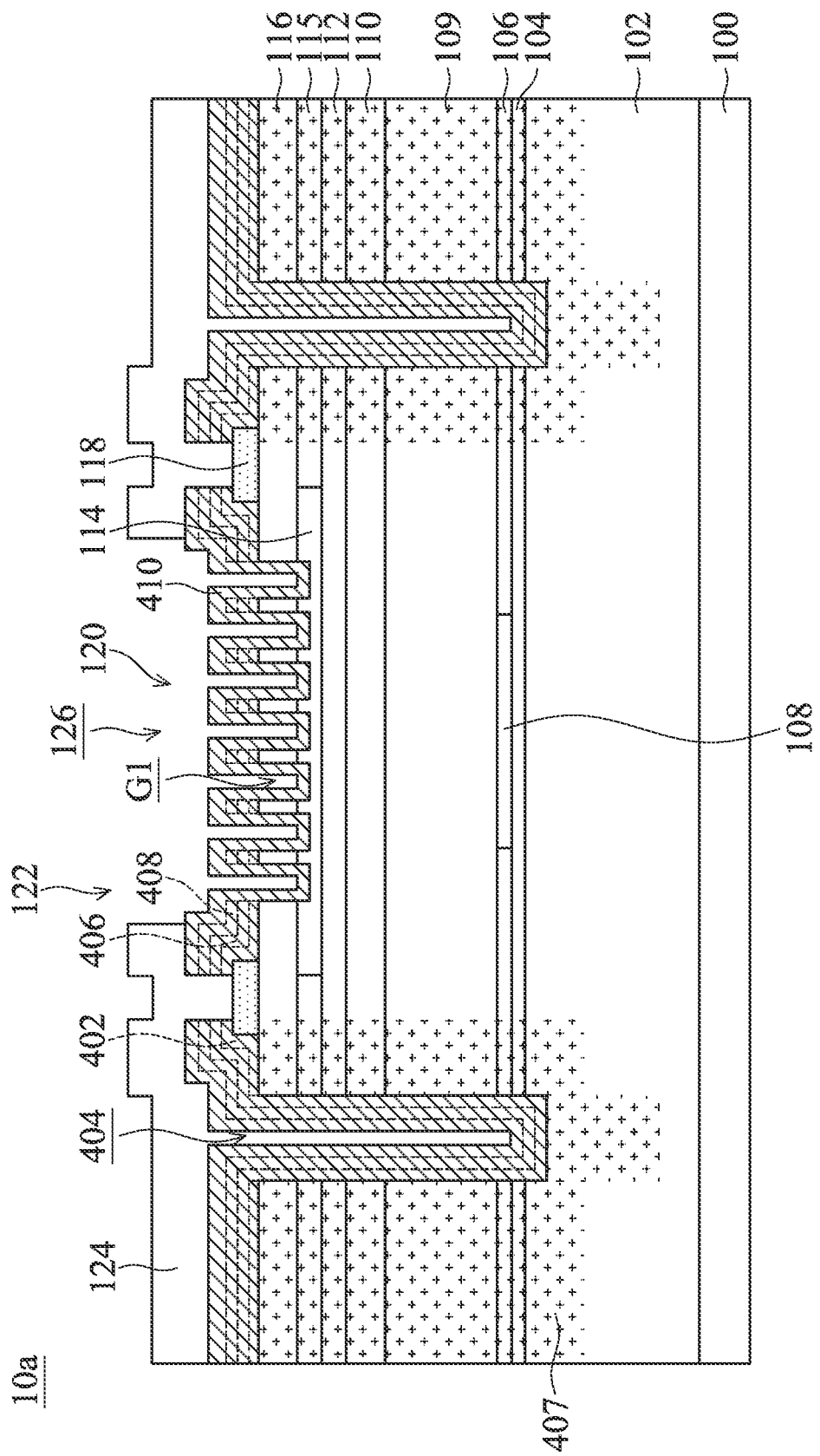
Figure 2:
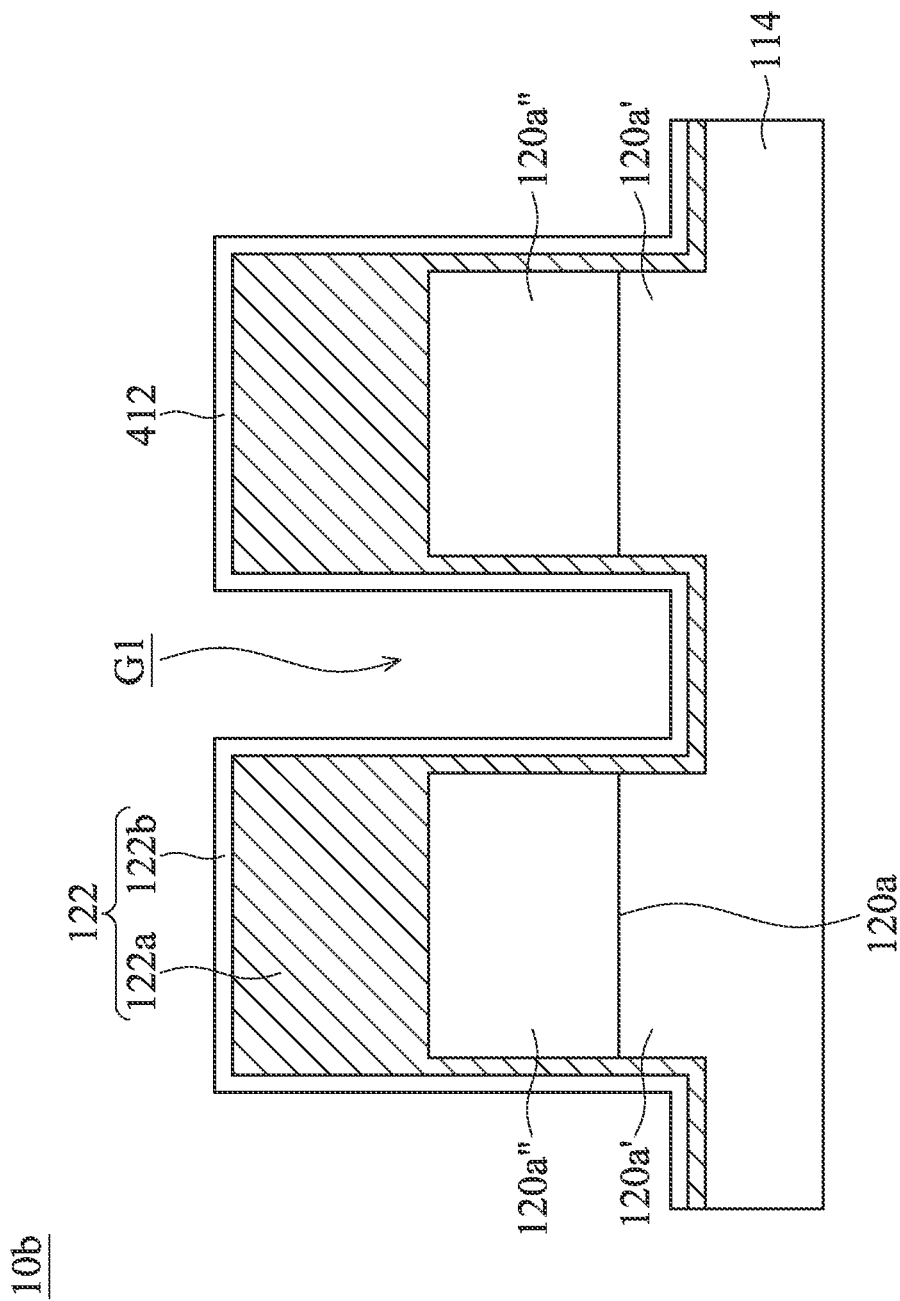

Next, a metal layer 124 is formed over the passivation layer 122, the high-contrast grating 120, and in the trench 404, as shown in FIG. 1J in accordance with some embodiments. In some embodiments, the metal layer 124 is in direct contact with the contact metal 118. The trench 404 may be filled with the metal layer 124. The metal layer 124 may include conductive material such as Au, Ti, Al, Pd, Pt, Cu, W, other suitable metal, its alloy, or a combination thereof. A metal layer material may be formed by electroplating, e-beam evaporation, resistive heating evaporation, sputtering, physical vapor deposition (PVD), chemical vapor deposition (CVD), atomic layer deposition (ALD), another suitable method, or a combination thereof. In some embodiments, the metal layer 124 is formed by the electroplating process. The metal layer material is then patterned by a photolithography and etching process to form an opening 126 over the grating element 120*a*. The opening 126 in the metal layer 124 may be directly above the aperture 108.

With thicker passivation layer 122 on top surface of the grating elements 120*a* than on the sidewalls and space between the grating elements 120*a*, the reliability may be improved while performance remains.

Many variations and/or modifications may be made to the embodiments of the disclosure. FIG. 2 is an enlarged cross-sectional representation of a VCSEL 10*b* in accordance with some embodiments. Some processes or devices are the same as, or similar to, those described in the embodiments above, and therefore the descriptions of these processes and devices are not repeated herein. The difference from the embodiments described above is that, as shown in FIG. 2 in accordance with some other embodiments, a fifth insulating layer 412 is further formed over the fourth insulating layer 410.

A fifth insulating layer 412 is conformally formed over the fourth insulating layer 410, as shown in FIG. 2 in accordance with some embodiments. The fifth insulating layer 412 may be also formed over the sidewalls and the bottom surface of the trench 404, and the sidewalls and the bottom surface of the air gaps G1 between the grating elements 120*a* of the high-contrast grating 120. The fifth insulating layer 412 may be formed over the fourth insulating layer 410 and extended into the trench 404 and the air gaps G1. The fifth insulating layer 412 may be made of silicon nitride, aluminum oxide, other suitable insulating material, or a combination thereof. The fifth insulating layer 412 may be formed by a CVD process (such as LPCVD, PECVD, SACVD, or FCVD), an ALD process, another applicable method, or a combination thereof.

In some embodiments, the fifth insulating layer 412 and the fourth insulating layer 410, the third insulating layer 408, the second insulating layer 406, and the first insulating layer 402 are made of different materials. In some embodiments, the fifth insulating layer 412 is made of aluminum oxide, and the fourth insulating layer 410, the third insulating layer 408, the second insulating layer 406, and the first insulating layer 402 are made of silicon nitride. The fifth insulating layer 412 may be referred to as a second sub-layer 122*b* of the passivation layer 122. The fourth insulating layer 410, the third insulating layer 408, the second insulating layer 406, and the first insulating layer 402 may serve as a first sub-layer 122*a* of the passivation layer 122. In some embodiments, the first sub-layer 122*a* is formed on the sidewalls and top surfaces of the grating elements 120*a*. In some embodiments, the first sub-layer 122*a* lines the top surface and the sidewall of the grating elements 120*a*.

With thicker passivation layer 122 on top surface of the grating elements 120*a* than on the sidewalls and space between the grating elements 120*a*, the reliability may be improved while performance remains. A second sub-layer 122*b* of the passivation layer 128 may also be further formed over the top surfaces and the sidewalls of the grating elements 120a. The first sub-layer 122a and the second sub-layer 122b may be formed with different materials.

Figure 3A:
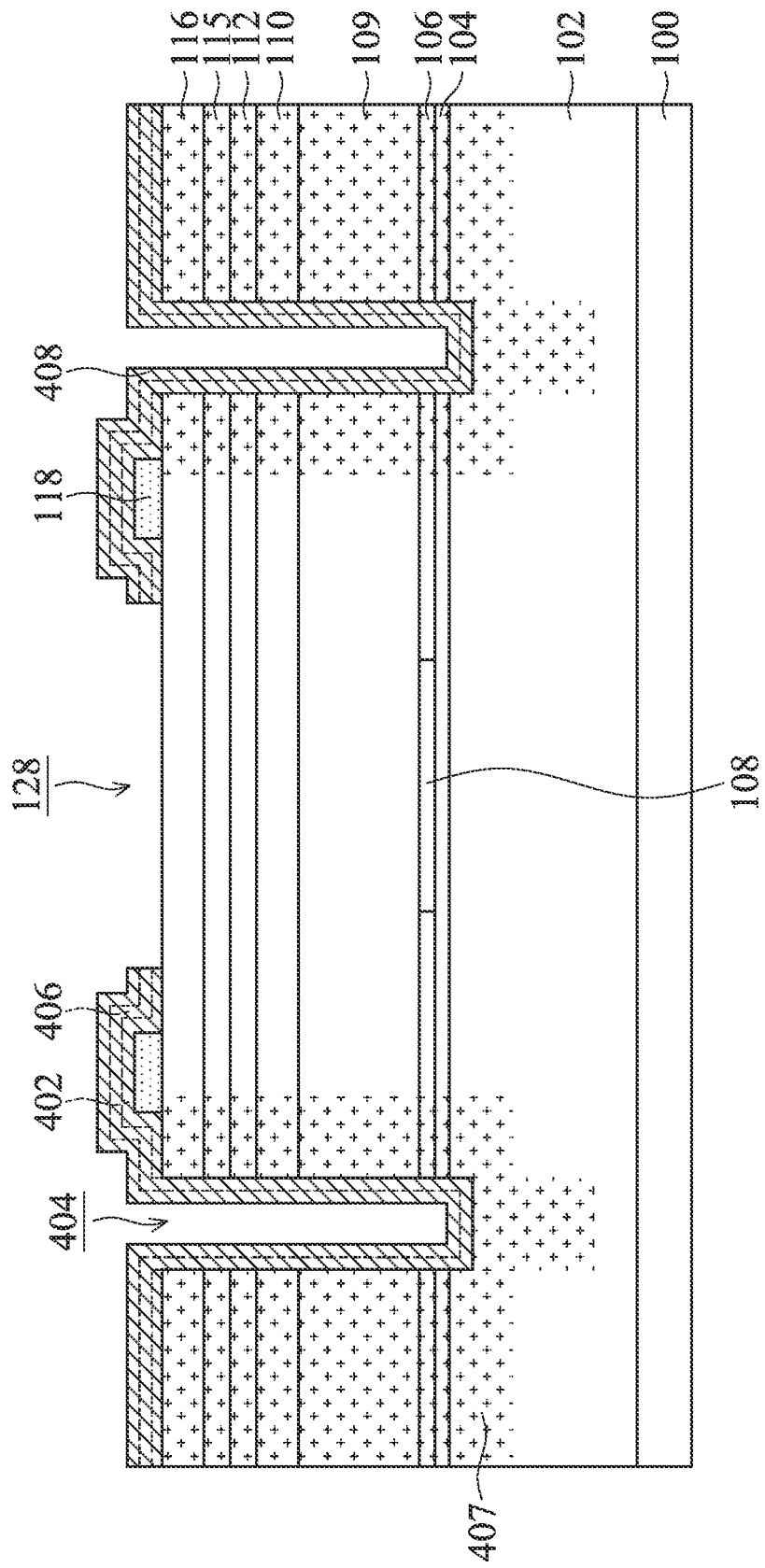
Figures 1, 3B:
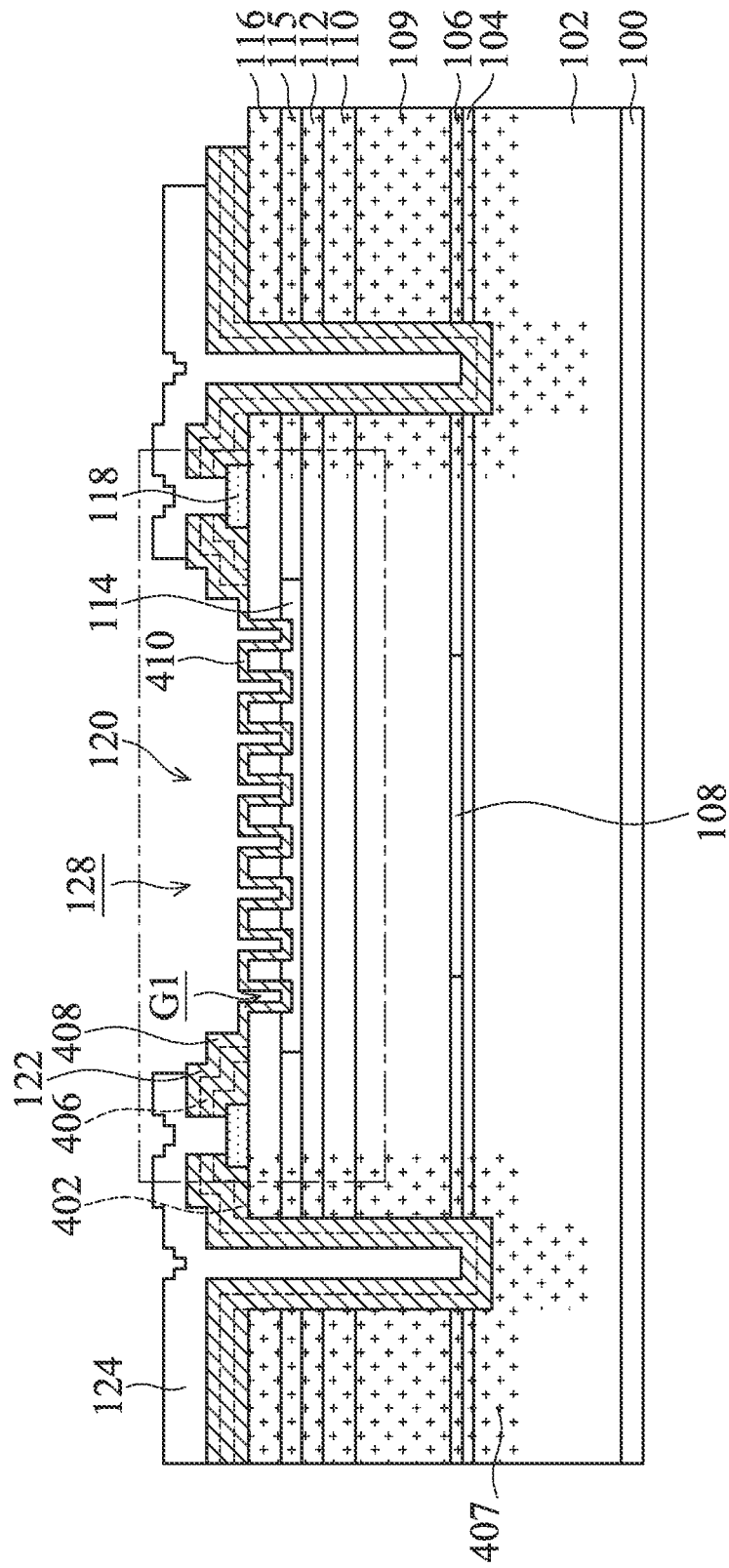
Figures 2, 3B:
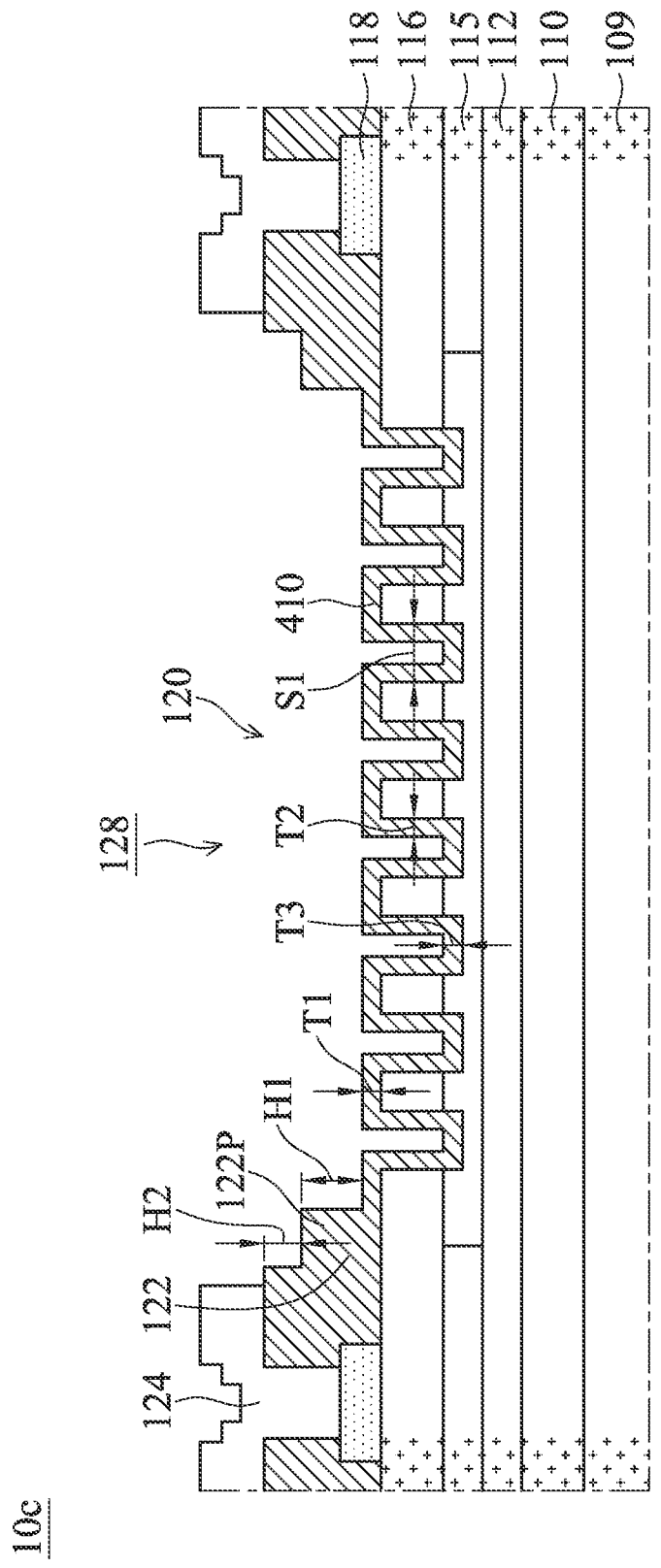

Many variations and/or modifications may be made to the embodiments of the disclosure. FIGS. 3A and 3B-1 are cross-sectional representations of various stages of forming a VCSEL 10c in accordance with some embodiments. Some processes or devices are the same as, or similar to, those described in the embodiments above, and therefore the descriptions of these processes and devices are not repeated herein. The difference from the embodiments described above is that, as shown in FIG. 3A in accordance with some other embodiments, the third insulating layer 408, the second insulating layer 406, and the first insulating layer 402 are removed before forming the high-contrast grating 120.

An opening 128 is formed through the third insulating layer 408, the second insulating layer 406, and the first insulating layer 402, as shown in FIG. 3A in accordance with some embodiments. The layer 116 may be exposed from the opening 128. The opening 128 may be formed in the third insulating layer 408, the second insulating layer 406, and the first insulating layer 402 by a lithography process, an etching process, other applicable processes, or a combination thereof.

Next, a high-contrast grating 120 is formed in the layer 116 through the opening 128, as shown in FIG. 3B-1 in accordance with some embodiments. Later, an oxide layer 114 is formed in the layer 115 under the high-contrast grating 120. Processes used to form the high-contrast grating 120 and the oxide layer 114 may be similar to, or the same as, those used to form the high-contrast grating 120 and the oxide layer 114 described in previous embodiments and are not repeated herein for brevity.

Later, the fourth insulating layer 410 is formed over the sidewalls and the bottom surface of the air gaps G1 between the grating elements 120a of the high-contrast grating 120, as shown in FIG. 3B-1 in accordance with some embodiments. In some embodiments, the fourth insulating layer 410 is in direct contact with the top surface of the layer 116 and the sidewalls of the grating elements 120a. In some embodiments, the fourth insulating layer 410 is formed by ALD, and thus the fourth insulating layer 410 can be uniformly deposited on the sidewalls of the grating elements 120a with small spacing S1 (e.g., in a range between about 100 and about 500 Å), so as to improve the reliability of the VCSEL 10c.

In some embodiments as shown in FIG. 3B-1, the passivation layer 122 formed over the grating elements 120a are thinner than the passivation layer 122 in the previous embodiments. Therefore, the power of the VCSEL 10c may be enhanced and the performance may be improved.

FIG. 3B-2 is an enlarged cross-sectional representation of the VCSEL 10c in accordance with some embodiments. In some embodiments, as shown in FIG. 3B-2, the passivation layer 122 over the high-contrast grating 120 only includes the fourth insulating layer 410. Therefore, the passivation layer 122 thickness over the top of the grating elements 120a is thinner than that in the embodiments shown in FIG. 1I-2.

In some embodiments, as shown in FIG. 3B-2, by adjusting the parameters of the deposition process (e.g., ALD) for forming the fourth insulating layer 410, the thickness T1 of the passivation layer 122 on top surfaces of the grating elements 120a is greater than the thickness T2 of the passivation layer 122 on sidewalls of the grating elements 120a. In some embodiments, the ratio of the thickness T1 to the thickness T2 may be greater than 1 and less than or equal to 3 ($1<T1/T2\leq 3$). In some embodiments, the ratio of the thickness T2 to the spacing S1 is in a range of about 0.05 to about 0.5.

In some embodiments, as shown in FIG. 3B-2, the thickness T1 of the passivation layer 122 on top surfaces of the grating elements 120a is greater than the thickness T3 of the passivation layer 122 on the second mirror 109 between adjacent grating elements 120a. The thickness T3 may also be the thickness of the passivation layer 122 on the oxide layer 114 between adjacent grating elements 120a. In some embodiments, the ratio of the thickness T1 to the thickness T3 may be greater than 1 and less than or equal to 3 ($1<T1/T2\leq 3$). In some embodiments, the thickness T2 is substantially the same as the thickness T3.

In addition, as shown in FIG. 3B-2, a protruding portion 122P of the passivation layer 122 is formed due to forming the opening 128. In some embodiments, the top surface of the protruding portion 122P is lower than the top surface of the passivation layer 122 directly above the contact metal 118. In some embodiments, the sidewall of the protruding portion 122P is shifted from the sidewall of the high-contrast grating 120. As shown in FIG. 3B-2, the top surface of the protruding portion 122P is higher than the top surface of the passivation layer 122 over the high-contrast grating 120 by a height H1, and the top surface of the protruding portion 122P is lower than the top surface of the passivation layer 122 directly above the contact metal 118 by a height H2.

With thicker passivation layer 122 on top surface of the grating elements 120a than on the sidewalls and space between the grating elements 120a, the reliability may be improved while performance remains. Etching back the passivation layer 122 over the grating elements 120a may enhance the power of the VCSEL 10c, and the performance may be improved.

Figure 4:
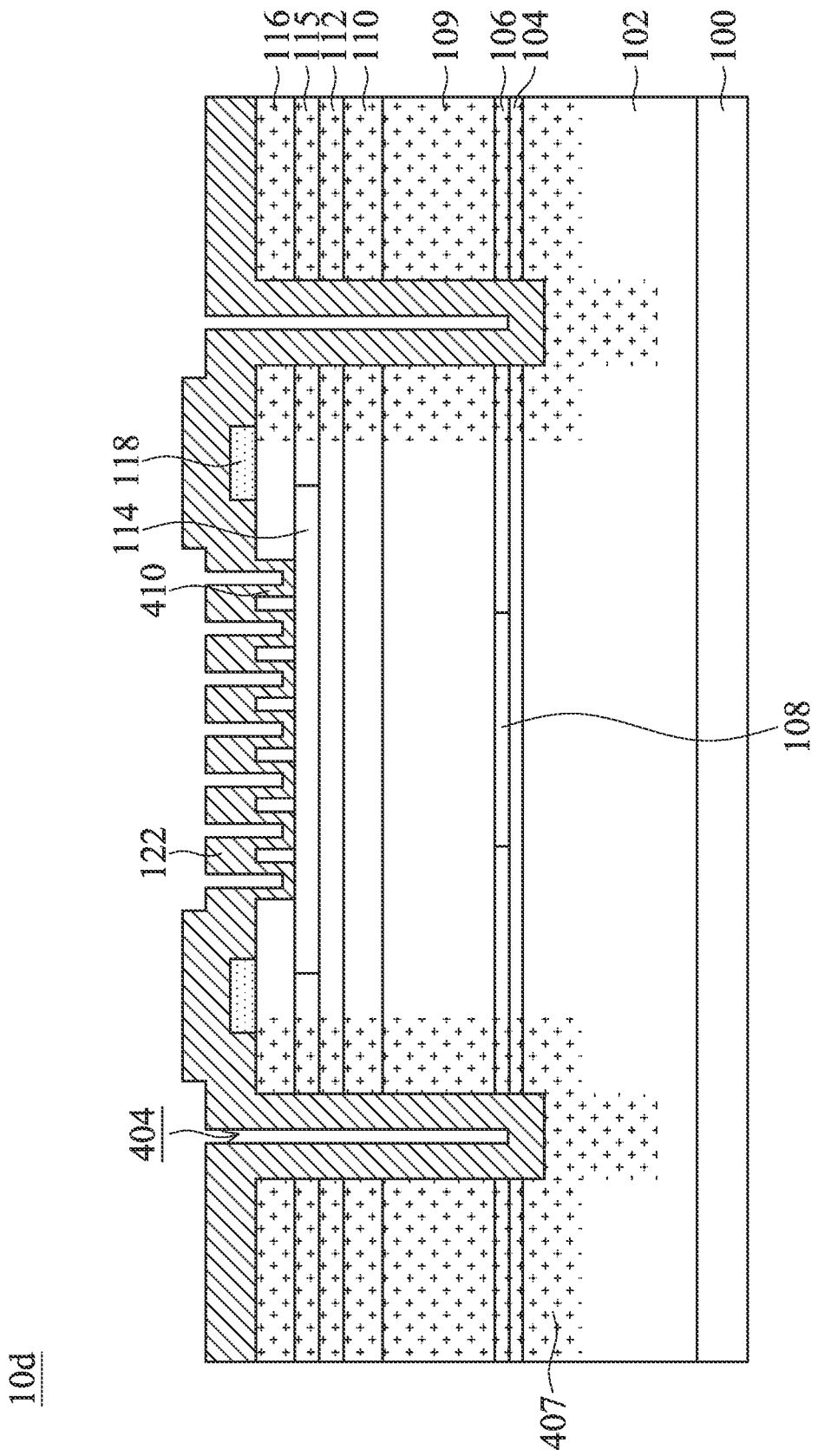
FIG. 4 is a cross-sectional representation of a modified VCSEL in accordance with some embodiments.

Many variations and/or modifications may be made to the embodiments of the disclosure. FIG. 4 is a cross-sectional representation of a VCSEL 10d in accordance with some embodiments. Some processes or devices are the same as, or similar to, those described in the embodiments above, and therefore the descriptions of these processes and devices are not repeated herein. The difference from the embodiments described above is that, as shown in FIG. 4 in accordance with some other embodiments, the oxide layer 114 is not patterned, and the grating elements 120a only include the layer 116.

In some embodiments, the top surface of the oxide layer 114 is level with the bottom surface of the grating elements 120a. In some embodiments, the top surface of the oxide layer 114 is level with the bottom surface of the passivation layer 122 formed in the air gaps G1. In some embodiments, the oxide layer 114 has a substantially flat top surface.

With thicker passivation layer 122 on top surface of the grating elements 120a than on the sidewalls and space between the grating elements 120a, the reliability may be improved while performance remains. The grating elements 120a may include a single portion of the layer 116.

As mentioned above, in the present disclosure, a VCSEL and a method of forming a VCSEL is provided. With the passivation layer on the top surface of the grating elements thicker than the passivation layer on the sidewalls of the grating elements or between the grating elements, the reliability may be improved while performance remains.

It should be noted that although some of the benefits and effects are described in the embodiments above, not every embodiment needs to achieve all the benefits and effects.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A vertical-cavity surface-emitting laser, comprising:
a substrate;
a first mirror disposed on the substrate;
an active layer disposed on the first mirror;
an oxide layer disposed on the active layer;
an aperture disposed on the active layer, wherein the aperture is surrounded by the oxide layer;
a second mirror disposed on the aperture and the oxide layer;
a high-contrast grating disposed on the second mirror, wherein the high-contrast grating comprises a first grating element and a second grating element, and the first grating element and the second grating element are spaced apart from each other with an air gap therebetween; and
a passivation layer disposed on the high-contrast grating, wherein a first thickness of the passivation layer on a top surface of the first grating element is greater than a second thickness of the passivation layer on a first sidewall of the first grating element.

2. The vertical-cavity surface-emitting laser as claimed in claim 1, wherein the air gap is partially filled with the passivation layer.

3. The vertical-cavity surface-emitting laser as claimed in claim 1, wherein an upper portion of the high-contrast grating comprises a first material, and a lower portion of the high-contrast grating comprises a second material that is different from the first material.

4. The vertical-cavity surface-emitting laser as claimed in claim 3, wherein the first material comprises a III-V compound semiconductor or a metal, and the second material comprises an insulator.

5. The vertical-cavity surface-emitting laser as claimed in claim 3, wherein a first refractive index of the first material is greater than a second refractive index of the second material.

6. The vertical-cavity surface-emitting laser as claimed in claim 3, wherein a bottom surface of the passivation layer is lower than an interface between the first material and the second material.

7. The vertical-cavity surface-emitting laser as claimed in claim 1, wherein the passivation layer comprises silicon nitride, aluminum oxide, or a combination thereof.

8. The vertical-cavity surface-emitting laser as claimed in claim 1, wherein the passivation layer comprises a first sub-layer on the high-contrast grating, and a second sub-layer on the first sub-layer.

9. The vertical-cavity surface-emitting laser as claimed in claim 8, wherein the first sub-layer lines the top surface of the first grating element and the first sidewall of the first grating element.

10. The vertical-cavity surface-emitting laser as claimed in claim 8, wherein the second sub-layer lines the first sidewall of the first grating element, a sidewall of the first sub-layer, and a top surface of the first sub-layer.

11. The vertical-cavity surface-emitting laser as claimed in claim 8, wherein the first sub-layer or the second sub-layer comprises silicon nitride, and the other of the first sub-layer or the second sub-layer comprises aluminum oxide.

12. The vertical-cavity surface-emitting laser as claimed in claim 1, wherein a third thickness of the passivation layer on the second mirror between the first grating element and the second grating element is les than the first thickness.

13. A vertical-cavity surface-emitting laser, comprising:
a substrate;
a first distributed Bragg reflector disposed on the substrate;
an active layer disposed on the first distributed Bragg reflector;
a first oxide layer disposed on the active layer;
an aperture disposed on the active layer, wherein the aperture is surrounded by the oxide layer;
a second distributed Bragg reflector disposed on the aperture and the first oxide layer;
a high-contrast grating disposed on the second distributed Bragg reflector, wherein the high-contrast grating comprises a plurality of grating elements protruding from a second oxide layer disposed on the second distributed Bragg reflector; and
a passivation layer disposed on the grating elements and the second oxide layer, wherein a first thickness of the passivation layer on top surfaces of the grating elements is greater than a second thickness of the passivation layer on the second oxide layer between two adjacent grating elements.

14. The vertical-cavity surface-emitting laser as claimed in claim 13, wherein the passivation layer over sidewalls of adjacent grating elements are separated from each other.

15. The vertical-cavity surface-emitting laser as claimed in claim 13, wherein a third thickness of the passivation layer on sidewalls of the grating elements is less than the first thickness.

16. The vertical-cavity surface-emitting laser as claimed in claim 13, wherein a lower portion of the grating elements and the second oxide layer are integrally formed.

17. The vertical-cavity surface-emitting laser as claimed in claim 13, wherein an upper portion of the grating elements comprises a first material having a first refractive index, the passivation layer comprises a second material having a second refractive index that is lower than the first refractive index.

18. The vertical-cavity surface-emitting laser as claimed in claim 17, wherein a bottom surface of the passivation layer is level with a top surface of the second oxide layer.

19. A method for forming a vertical-cavity surface-emitting laser, comprising:
providing a semiconductor structure, wherein the semiconductor structure comprises a substrate, a first mirror on the substrate, an active layer on the first mirror, a first oxide layer on the active layer, an aperture on the active layer and surrounded by the first oxide layer, and a second mirror on the aperture and the first oxide layer;
forming a high-contrast grating on the second mirror of the semiconductor structure, wherein the high-contrast grating comprises a plurality of grating elements spaced apart from one another; and
forming a passivation layer on the grating elements, wherein a first thickness of the passivation layer on top surfaces of the grating elements is greater than a second thickness of the passivation layer on the sidewalls of the grating elements.

20. The method for forming a vertical-cavity surface-emitting laser as claimed in claim 19, further comprising:

forming insulating layers over the aperture;
removing the insulating layers over the aperture before forming the passivation layer.

* * * * *